US012751221B2

(12) United States Patent
Väyrynen et al.

(10) Patent No.: US 12,751,221 B2
(45) Date of Patent: Sep. 29, 2026

(54) SEMICONDUCTOR DOPING METHOD AND AN INTERMEDIATE SEMICONDUCTOR DEVICE

(71) Applicant: BENEQ OY, Espoo (FI)

(72) Inventors: Katja Väyrynen, Espoo (FI); Emma Salmi, Espoo (FI); Erik Östreng, Espoo (FI)

(73) Assignee: BENEQ OY, Espoo (FI)

( * ) Notice: Subject to any disclaimer, the term of this patent is extended or adjusted under 35 U.S.C. 154(b) by 638 days.

(21) Appl. No.: 18/250,777

(22) PCT Filed: Oct. 28, 2021

(86) PCT No.: PCT/FI2021/050727
§ 371 (c)(1),
(2) Date: Apr. 27, 2023

(87) PCT Pub. No.: WO2022/090629
PCT Pub. Date: May 5, 2022

(65) Prior Publication Data

US 2023/0411153 A1 Dec. 21, 2023

(30) Foreign Application Priority Data

Oct. 29, 2020 (FI) ..................................... 20206076

(51) Int. Cl.
*H01L 21/02* (2006.01)
*C23C 16/40* (2006.01)
(Continued)

(52) U.S. Cl.
CPC ........ *H10P 14/3441* (2026.01); *C23C 16/402* (2013.01); *C23C 16/45529* (2013.01);
(Continued)

(58) Field of Classification Search
CPC . C23C 16/45529; C23C 16/56; C23C 16/402; C23C 16/40; H01L 21/256;
(Continued)

(56) References Cited

U.S. PATENT DOCUMENTS

| | | | |
|---|---|---|---|
| 10,163,695 | B1 | 12/2018 | Joi et al. |
| 2013/0040447 | A1 | 2/2013 | Swaminathan et al. |

(Continued)

FOREIGN PATENT DOCUMENTS

| | | | |
|---|---|---|---|
| CN | 109273400 | A | 1/2019 |
| WO | 9813861 | A1 | 4/1998 |
| WO | 2020197864 | A1 | 10/2020 |

OTHER PUBLICATIONS

Finnish Search Report issued by the Finnish Patent and Registration Office in relation to Finnish Patent Application No. 20206076 dated Jun. 29, 2021 (1 page).

(Continued)

*Primary Examiner* — Joseph A Miller, Jr.
(74) *Attorney, Agent, or Firm* — Carter, DeLuca & Farrell, LLP

(57) ABSTRACT

The method for doping a semiconductor includes the following steps in the following order: separation layer deposition step, in which a separation layer is deposited on the surface of a substrate, a mixture material source layer deposition step, in which a mixture material source layer including a mixture material is deposited on the separation layer, the mixture material of the mixture material source layer including a dopant substance, and annealing the substrate, the separation layer, and the mixture material source layer in an annealing step to arrange diffusion of dopant substance from the mixture material source layer to the substrate and to the separation layer.

15 Claims, 10 Drawing Sheets

(51) Int. Cl.
*C23C 16/455* (2006.01)
*C23C 16/56* (2006.01)
*H10P 14/20* (2026.01)
*H10P 14/60* (2026.01)

(52) U.S. Cl.
CPC ........ *C23C 16/45553* (2013.01); *C23C 16/56* (2013.01); *H10P 14/6339* (2026.01)

(58) Field of Classification Search
CPC ........... H01L 21/0228; H01L 21/02573; H01L 21/02104; H01L 21/02129; H01L 21/022
See application file for complete search history.

(56) References Cited

U.S. PATENT DOCUMENTS

| | | | |
|---|---|---|---|
| 2016/0260611 | A1 | 9/2016 | Consiglio et al. |
| 2019/0385850 | A1 | 12/2019 | Arghavani et al. |
| 2021/0313178 | A1 | 10/2021 | Nakano |

OTHER PUBLICATIONS

International Search Report issued by the Finnish Patent and Registration Office acting as the International Searching Authority in relation to International Application No. PCT/FI2021/050727 dated Feb. 17, 2022 (12 pages).

Written Opinion of the International Searching Authority issued by the Finnish Patent and Registration Office acting as the International Searching Authority in relation to International Application No. PCT/FI2021/050727 dated Feb. 17, 2022 (8 pages).

PRIOR ART

SEMICONDUCTOR DOPING METHOD AND AN INTERMEDIATE SEMICONDUCTOR DEVICE

CROSS-REFERENCE TO RELATED APPLICATIONS

This application is a national phase entry under 35 U.S.C. 371 of PCT International Application No. PCT/FI2021/050727 filed Oct. 28, 2021, which claims priority to Finnish Patent Application No. 20206076, filed Oct. 29, 2020, the disclosure of each of these applications is expressly incorporated herein by reference in their entirety.

FIELD OF THE INVENTION

The present invention relates to a semiconductor doping method, and an intermediate semiconductor device.

BACKGROUND OF THE INVENTION

Controlled introduction of impurity atoms into a semiconductor substrate is a cornerstone process in semiconductor and integrated circuit (IC) manufacture, and a key enabler in the proliferation of smaller and smaller semiconductor elements like metal-oxide-semiconductor field effect transistors (MOSFETs) fabricated on the surface of a substrate. In the art, the controlled introduction of impurities to the semiconductor bulk or other semiconductor regions is usually called doping, and the impurity atoms are called dopants or dopant substances. Basic concepts of semiconductor physics and electronics are well known in the art. Doping of the semiconductor determines for example the conduction type (n or p type conductivity), conductivity behaviour under excitation of electric and magnetic fields, temperature etc. In short, without a good control of semiconductor doping, modern day electronics and IC technologies would not be possible.

Main methods for doping are currently diffusion and ion implantation. In a diffusion process, the dopant atoms are introduced from the gas phase or by using solid state sources like doped oxides deposited on the substrate and then "driving" the impurities from the solid state source layer to the substrate in an annealing or "baking" step where the diffusivity of the impurities is greatly increased by exposing the substrate (the surface region of which is now implanted or covered with dopants) to high temperatures, usually in the range of 800° C.-1200° C. In prior art, with diffusion processes the doping concentration decreases monotonically from the surface, and the in-depth distribution of the dopant is determined mainly by the temperature and diffusion time. Known methods for introducing the said solid state layer of dopants in the prior art include the chemical vapor deposition method (CVD) and its special variant, the atomic layer deposition method (ALD).

In ion implantation, impurity ions are driven to the surface by kinetic means by accelerating the impurity ions and targeting the substrate with a high velocity ion beam. The resulting concentration of impurities usually has a "kink", a local maximum of dopants a bit under the surface of the substrate, whereas with diffusion processes the maximum concentration of the impurities is usually located at the surface level.

Diffusion and ion implantation complement each other in the semiconductor industry. For example, diffusion is generally used to form a deep junction, such as an n-doped large area in a CMOS (Complementary Metal Oxide Semiconductor) device, while ion implantation is utilized to form a shallow junction, like a source/drain junction of a MOSFET. Being a direction-dependent method (owing to the beam of ions propagating in some general direction before hitting the substrate), ion implantation has its limitations when a planar semiconductor substrate is no longer, in a microscopic scale, truly planar, but instead comprises trench and pit-like three-dimensional (3D) forms. In other words, ion implantation process is anisotropic in terms of the doping direction. This increases the demands for diffusion based doping which is basically an isotropic process—diffusion is direction-independent as long as the source materials are available on the surface of the substrate, no matter how complex the 2D or 3D structure of the surface is. However, a major advantage of the ion implantation is the possibility to control the doping profile: In ion implantation, the concentration of the impurity atoms is independent of the depth from the surface which makes it possible e.g. to place a semiconductor junction at a certain depth in the substrate. This is because the concentration and the kinetic energy of the beam of impurity ions can be controlled separately from one another. In general, controlling concentration happens through the control of duration of the ion implantation process. This is a major challenge for diffusion doping where, in prior art, dopant concentration and junction depth cannot be independently controlled very well.

Thus, there is a need for an isotropic doping process, that is, diffusion doping, but with a greater control of the doping profile both in terms of concentration and depth. Especially challenging has been to control a low concentration of the dopants in the doped material like a semiconductor substrate. Low concentration is needed with many modern electronic applications like super-junction MOSFET (SJ-MOSFETs) where the doped regions form pillar-like volumes with complex 3D shapes and need accurate doping control in terms of doping profile and doping concentration.

BRIEF DESCRIPTION OF THE INVENTION

An object of the present invention is to provide a diffusion doping method and an intermediate semiconductor device.

BRIEF DESCRIPTION OF THE INVENTION

An object of the present invention is to provide a diffusion doping method and an intermediate semiconductor device.

The preferred embodiments of the invention are disclosed in the dependent claims.

The invention is based on the idea of controlling the dopant diffusion to the substrate by two complementary facets that allow a very high-precision tuning of the doping profile. As the first facet, the present invention discloses a separation layer that separates the source of the dopant atoms to a distance away from the surface of the original substrate. As the second facet, the present invention discloses a mixture material source layer which is the source of impurity atoms having a very exact molecular structure in the depth direction of the doping process, held at a distance from the original substrate surface by the separation layer.

As an aspect of the present invention, a method for doping a semiconductor is disclosed. The method comprises an initial step where a semiconductor substrate comprising a surface is placed into a deposition tool. The method comprises, in the following order, the steps of a) depositing a separation layer on the surface of a substrate in a separation layer deposition step, in which the separation layer is deposited on the surface of a substrate, b) depositing a mixture material source layer in a mixture material source layer deposition step, in which the mixture material source layer comprising a mixture material is deposited on the separation layer, the mixture material of the mixture material source layer comprising a dopant substance, and c) annealing the substrate, the separation layer, and the mixture material source layer in an annealing step, in which the substrate, the separation layer, and the mixture material source layer are heated to an elevated temperature to arrange diffusion of dopant substance from the mixture material source layer to the substrate and to the separation layer.

In the invention, as a basic idea, the separation layer is essentially void of the dopant substance, thus distancing the source of the dopant substance (that is, the mixture material source layer) further away from the surface of the substrate. Mixture material source layer has a very specific composition of the dopant substance or dopant substances.

Stated differently, a method for doping a semiconductor is disclosed. The method comprises an initial step where a semiconductor substrate comprising a surface is placed into a deposition tool. The method comprises, in the following order, the steps of a) depositing a separation layer on the surface of a substrate in a separation layer deposition step, in which a separation layer is deposited on the surface of a substrate, b) depositing a mixture material source layer in a mixture material source layer deposition step, in which the mixture material source layer comprising a mixture material is deposited on the separation layer, the mixture material of the mixture material source layer comprising a dopant substance, and c) annealing the substrate and layers deposited in the previous steps in an annealing step, in which the substrate and the layers deposited in the previous steps are heated to an elevated temperature to arrange diffusion of dopant substance from the mixture material source layer to the other deposited layers and to the substrate.

As an embodiment, the separation layer deposition step is deposited with the atomic layer deposition method ("ALD" or "ALD method"). ALD allows a self-limiting growth with maximal surface uniformity, thickness uniformity and pinhole-free nature of the deposited layer or film, which are important for the uniform distribution of the dopants into the substrate.

As another embodiment, the atomic layer deposition of the separation layer deposition step is deposited with a first precursor being selected from the group of a precursor for a stable oxide and an oxidising precursor, and a second precursor being the other from the group of a precursor for a stable oxide and an oxidising precursor. This step may result in a deposit of e.g. hafnium oxide or aluminum oxide that are well known for their stability and durability in e.g. elevated process temperatures.

As another embodiment, the atomic layer deposition of the separation layer deposition step is deposited with a first precursor being selected from the group of a silicon precursor and an oxidising precursor, and a second precursor being the other from the group of a silicon precursor and an oxidising precursor. These reactants yield a silicon oxide (for example, silicon dioxide) which is an advantageous material as a separation layer.

Still as an embodiment, the ALD method of the separation layer deposition step is arranged to deposit the separation layer of a thickness of 0.5 nm-15 nm; or more preferably 1 nm-5 nm; or most preferably 2 nm-3 nm. Separation layer thickness affects the dopant substance density in the substrate under doping so its selection is important to achieve a wanted doping level. The range of 2-3 nm is especially advantageous for the low doping regime of the substrate.

As an embodiment, the mixture material source layer deposition step is deposited with the atomic layer deposition method. Again, ALD allows a self-limiting growth with maximal surface uniformity, thickness uniformity and pinhole-free nature of the deposited layer or film, which are important for the uniform distribution of the dopants into the substrate. ALD also makes a very uniform and accurate dosage of the doping material to the mixture material source layer possible by arranging the source layer as a mixture material source layer.

As an embodiment, the atomic layer deposition of the mixture material source layer deposition step is arranged to deposit the mixture material with a first precursor being selected from the group of a precursor for a stable oxide and an oxidising precursor, arranged to deposit a first sub-material, a second precursor being the other from the group of a precursor for a stable oxide and an oxidising precursor, arranged to deposit the first sub-material. A third precursor is selected from the group of a dopant precursor and an oxidising precursor, arranged to deposit a second sub-material, and a fourth precursor is the other from the group of a dopant precursor and an oxidizing precursor, arranged to deposit the second sub-material. This is an advantageous recipe for the mixture material comprising a dopant source material and a carrier material, or a mixture thereof.

Naturally, there can be more sub-materials to generate a more advanced mixture material source layer. In other words, a fifth precursor may be arranged to deposit a third sub-material, and a sixth precursor may be arranged to deposit a third sub-material, etc.

As an embodiment, the atomic layer deposition of the mixture material source layer deposition step arranged to deposit the mixture material is deposited with a first precursor being selected from the group of a silicon precursor and an oxidising precursor, arranged to deposit a first sub-material, a second precursor being the other from the group of a silicon precursor and an oxidizing precursor, arranged to deposit the first sub-material. A third precursor is selected from the group of a dopant precursor and an oxidising precursor, arranged to deposit a second sub-material, and a fourth precursor is the other from the group of a dopant precursor and an oxidizing precursor, arranged to deposit the second sub-material. Silicon oxide is a very stable material withstanding high process temperatures.

As another embodiment, the atomic layer deposition of the mixture material source layer deposition step arranged to deposit the mixture material is deposited with a first precursor being selected from the group of a precursor for a stable oxide and an oxidising precursor, arranged to deposit a first sub-material, a second precursor being the other from the group of a precursor for a stable oxide and an oxidising precursor, arranged to deposit a first sub-material, and a third precursor being a dopant precursor, arranged to introduce dopants to the first sub-material to arrange the mixture material of the mixture material source layer from the first sub-material. In other words, the third precursor or a portion of the third precursor is intermixed with the first sub-material, generating a mixture material of the mixture material source layer.

As another embodiment, the atomic layer deposition of the mixture material source layer deposition step arranged to deposit the mixture material is deposited with a first precursor being selected from the group of a silicon precursor and an oxidising precursor, arranged to deposit a first sub-material, a second precursor being the other from the group of a silicon precursor and an oxidising precursor, arranged to deposit the first sub-material, and a third precursor being a dopant precursor, arranged to introduce dopants to the first sub-material to arrange the mixture material of the mixture material source layer from the first sub-material. As above, the third precursor or a portion of it is intermixed with the first sub-material, specifically silicon oxide, and a mixture material is thus generated. Silicon oxide is a very stable material as a host of the dopant substance in the mixture material source layer.

As an embodiment, the atomic layer deposition of the mixture material source layer deposition step is arranged to deposit the mixture material source layer of a thickness of 0.1 nm-5 nm, more preferably 0.2 nm-2 nm or most preferably 0.4 nm-1 nm (nm meaning nanometre). For low doping regimes, these values yield surprisingly good results.

As another embodiment, the atomic layer deposition of the mixture material source layer deposition step is arranged to deposit the mixture material source layer comprising the mixture material, and the atomic ratio of the dopant substance in the deposited mixture material source layer is arranged to be 0.001 at. %-10 at. %, or more preferably 0.01 at %-1 at % or most preferably 0.05 at %-0.5 at %. For low doping regimes, these values yield surprisingly good results.

As another embodiment, the method comprises, after step b), the mixture material source layer deposition step, and before step c), the annealing step, a step b2), a diffusion drain layer deposition step, in which a diffusion drain layer is deposited over the mixture material source layer. In step c), the annealing step, the substrate, the separation layer, the mixture material source layer and the diffusion drain layer are annealed and heated to an elevated temperature to arrange diffusion of the dopant substance from the mixture material source layer to the substrate, to the diffusion drain layer and to the separation layer.

As an embodiment, the diffusion drain layer deposition step is deposited with an atomic layer deposition method. As above, the atomic layer deposition method enables a good control in the introduction of materials and in many cases, like with ALD, a self-limiting growth with maximal surface uniformity, and pin-hole-free nature of the deposited layer or film.

As yet another embodiment, the atomic layer deposition of the diffusion drain layer deposition step is deposited with a first precursor being selected from the group of a stable oxide and an oxidising precursor, and a second precursor being the other from the group of a stable oxide and an oxidizing precursor. Oxides are thermally stable materials and thus well-versed for elevated process temperatures.

As yet another embodiment, the atomic layer deposition of the diffusion drain layer deposition step is deposited with a first precursor being selected from the group of a silicon precursor and an oxidising precursor, and a second precursor being the other from the group of a silicon precursor and an oxidizing precursor. Oxides are thermally stable materials and thus well-versed for elevated process temperatures.

As still another embodiment, the diffusion drain layer deposition step is arranged to deposit the diffusion drain layer of a thickness of 1 nm-10 nm; or more preferably 2 nm-8 nm; or most preferably 3 nm-5 nm. Diffusion drain thickness is another relevant parameter in adjusting the dopant density in the semiconductor substrate.

As yet another embodiment, the elevated temperature of the annealing step is between 800° C.-1100° C., more preferably between 850° C.-1000° C. and most preferably between 900° C.-950° C. A correct choice of the annealing temperature affects the dopant density and distribution in the semiconductor substrate.

As another embodiment, after the annealing step c), as step d), the etching step, the layers deposited according to the method and its embodiments are etched away and removed from the doped substrate. The separation layer, the mixture material source layer and the possible diffusion drain layer may be not needed in the final operation of the semiconductor device fabricated on the semiconductor substrate, or even in the next steps of the semiconductor manufacture.

As an aspect of the present invention, an intermediate semiconductor device is disclosed. The intermediate semiconductor device comprises a semiconductor substrate comprising a surface. The intermediate semiconductor device comprises a dopant source layer stack comprising a) a separation layer on the surface of a substrate, b) a mixture material source layer on the separation layer, the mixture material source layer comprising a mixture material comprising a dopant substance, the atomic ratio of the dopant substance in the mixture material source layer is arranged to be 0.001 at. %-10 at. %, or more preferably 0.01 at. %-1 at. % or most preferably 0.05 at. %-0.5 at. %. As above, this structure enables accurate diffusion doping distribution into the substrate.

As an embodiment, the dopant substance comprises boron, phosphorous, antimony or arsenic.

In an embodiment, the separation layer comprises a stable oxide, and the mixture material source layer comprises phosphorous oxide and a stable oxide.

In an embodiment, the separation layer comprises a stable oxide, and the mixture material source layer comprises or boron oxide and a stable oxide.

In another embodiment, the separation layer comprises a stable oxide, and the mixture material source layer comprises or arsenic oxide and a stable oxide.

In yet another embodiment, the separation layer comprises a stable oxide, and the mixture material source layer comprises or antimony oxide and a stable oxide.

As the mixture material source layer is arranged to be the source of the dopant material, phosphorous oxide, boron oxide, arsenic oxide and antimony oxide are advantageous choices each comprising well-understood dopant substances in the semiconductor industry. Incorporated with a stable oxide, the diffusion process of the dopants during annealing can be controlled well.

In an embodiment, the separation layer comprises silicon dioxide, and the mixture material source layer comprises phosphorous oxide and silicon dioxide.

In an embodiment, the separation layer comprises silicon dioxide, and the mixture material source layer comprises boron oxide and silicon dioxide.

In an embodiment, the separation layer comprises silicon dioxide, and the mixture material source layer comprises arsenic oxide and silicon dioxide.

In an embodiment, the separation layer comprises silicon dioxide, and the mixture material source layer comprises antimony oxide and silicon dioxide.

Related to the four embodiments immediately above, since the mixture material source layer is arranged to be the source of the dopant material, phosphorous oxide, boron oxide, arsenic oxide or antimony oxide are advantageous choices for the source of dopant substance, each comprising well-understood dopant substances in the semiconductor industry. Incorporated with a silicon dioxide, the diffusion process of the dopants during annealing can be controlled well.

In an embodiment, the intermediate semiconductor device comprises a diffusion drain layer on the mixture material source layer. Again, diffusion drain layer enables good control of the doping density by creating also a diffusion pull away from the substrate to be doped to the dopant atoms.

An advantage of the invention is that an accurate doping profile can be generated into the semiconductor substrate and both doping depth d and the doping concentration at a certain depth C(d) can be controlled independently of one another. This holds both for very small features in the semiconductor surface like so-called trenches which are usually etched 3D features in the nanometer scale (e.g. 10 nm-50 nm) on and in the surface of the semiconductor substrate created during some semiconductor technology intermediate process phase, and at the same time for the area of the entire semiconductor substrate, for example a single crystal silicon (Si) wafer with a diameter of 25 mm-300 mm.

To summarise, the current invention discloses a method and an intermediate product which enables and incorporates very low, yet isotropic dopant concentration profiles that are constant over the entire range of spatial features, from the nanometer scale of semiconductor nanostructure to the desimeter scale of semiconductor wafers.

In the present application, the term "semiconductor" may refer to any material that is an insulator at a very low temperature, but which has relevant electrical conductivity at a room temperature (20° C.). Semiconductors may comprise elemental semiconductors, for example silicon or germanium, compound semiconductors, such as group IV compound semiconductors such as SiC and SiGe, group III-V semiconductors such as GaP, GaAs, AlN and GaN, or group II-VI semiconductors such as ZnS, CdS, CdTe, ZnO. The term "semiconductor" includes intrinsic semiconductors and extrinsic semiconductors that are doped with one or more selected materials, including semiconductors having p-type doping materials and n-type doping materials. The term semiconductor also includes composite materials comprising a mixture of semiconductors.

In the present application, the term "dopant substance" refers to ions, atoms, compounds or combinations thereof that are introduced into a bulk or host material, usually in small quantities relative to the density of the material atoms or other constitutive units in the host, bulk or substrate material to affect the host material's chemical, electrical or other physical properties. Dopants include atoms, compounds, or any aggregates or combinations of these that are introduced in a semiconductor to affect the semiconductor's electrical characteristics, such as the semiconductor's electrical conductivity and resistance. Dopants useful in the present application comprise p-type dopants such as boron, n-type dopants such as phosphorous, antimony and arsenic, and combinations of n-type dopants and p-type dopants. Here, p-type dopants have usually one or more valence electrons less than the host material, and the altered ability to carry current (and alter the conductivity) is based on a "hole" or "holes" introduced by the p-type dopant or dopants into the material. Such dopants are also called "acceptors" for their ability to accept a charge carrier, usually an electron. Similarly, n-type dopants have one or more valence electrons more than the host material, and the altered ability to e.g. carry current (and alter the conductivity) is based on the extra electrons introduced by the dopant or dopants. For this reason, n-type dopants are also called "donors" as they "donate" the extra electron or electrons into the conduction and charge carrying of the semiconductor material.

In the present application, the term "doping" means the controlled introduction of one or more dopant substances into the bulk, host or substrate material to alter its characteristics as defined above in relation to "dopant substance".

In the present application, the term "dopant substance concentration depth profile" or "dopant concentration depth profile" is a characteristic related to the spatial distribution of a dopant or mixture of dopants in a semiconductor structure, such as a semiconductor layer. Dopant concentration depth profile may refer to a one-dimensional distribution of the concentrations of a dopant or mixture of dopants as a function of distance from a surface. However, dopant concentration depth profile may also refer to a two dimensional or three dimensional distribution of the concentrations of a dopant or mixture of dopants corresponding to a two dimensional area or three dimensional volume as a function of distance from a defined patch on the surface. The present application discloses, in particular, a method and a related semiconductor product wherein the characteristics of a dopant concentration depth profile can be controlled accurately.

In the present application, the term "precursor" (also called "reactant") means one or more gases or vapor-phase materials that take part in a chemical reaction or contribute a gas-phase substance that takes part in a reaction. Said chemical reaction can take place in the gas phase, or between a gas phase and a surface of a substrate, or between a gas phase and some species on a surface of a substrate.

In the present application, the term "surface of a substrate" means an surface having same composition as the bulk of the substrate, and also any surface of a layer or layers or surface of a film or films, or chemisorbed species natively grown or purposefully deposited on the surface of the substrate, e.g. with the method steps of the present invention. Surface of a substrate may be planar or have a more complex three-dimensional shape e.g. comprising a nano- or micro-structure.

In the present application, the term "precursor" means one or more gases or vapor-phase materials that take part in a chemical reaction or contribute a gas-phase substance that takes part in a reaction and comprise a dopant substance. Said chemical reaction can take place in a gas phase, or between a gas phase and a surface of a substrate, or between a gas phase and some species on a surface of a substrate. A "dopant precursor" may comprise a phosphorous precursor, an arsenic precursor, a boron precursor or an antimony precursor.

In the present application, an "atomic layer deposition method" or "ALD method" or "ALD" means a deposition method in which at least a first precursor and a second precursors are supplied to a reaction chamber successively in an alternating manner such that a surface of the substrate is subjected successively to reactions of at least the first precursor and the second precursor. In the context of this application the ALD method comprises an ideal atomic layer deposition in which the successively and in alternating manner supplied at least first precursor and second precursor react on the surface of the substrate so that the surface reactions are truly self-limiting and the first and the second precursor react with the surface so that at most only one monolayer is grown on the surface during one ALD cycle comprising the sequentially feeding of the at least first precursor and second precursor. Accordingly, in the ideal ALD the at least first and second precursors react with the surface of a material or substrate one at a time in a sequential, self-limiting, manner. Further, in the context of this application the "atomic layer deposition method" or "ALD method" also comprises a deposition method in which at least part of the reactions of the at least first and second precursor occur as a surface reaction according to principles of atomic layer deposition (resulting in an ideal ALD growth) and part of the reactions of at least the first and second occur in gas phase above the surface of the substrate and the reaction product of the gas phase reactions react with the surface of the substrate (resulting in a cyclical CVD kind of growth). Thus, the concept of "atomic layer deposition" or "ALD", in the present application, at least some of the growth of the deposit must occur through the ideal ALD growth mechanism. In the practical implementations of the ALD method, the growth of film seldom happens completely only through an ideal ALD growth mechanism, but instead the growth has also a contribution from reactions in gas phase above the surface of the substrate. In this case, the reaction product of the gas phase reactions above the surface of the substrate then reacts with the surface of the substrate to also grow film or deposit on the surface.

In the present application, a "substrate" refers to any material, usually a wafer of solid material, having a surface onto which a material can be deposited. Importantly, a substrate may include bulk or host material such as single crystal silicon or glass, but also one or more deposited layers or chemisorbed species overlying the host or bulk material. Further, the substrate can include various features typical to semiconductor and lithographical technologies, such as 3D features like vias and trenches, or e.g. conductive traces or electrodes comprising for example metal or a conductive oxide like an indium doped tin oxide, for example sputtered on the substrate.

In the present application, relative concentrations of elements related to dopant substances may be stated with atomic ratio or atomic percent (abbreviated at. %), which gives the percentage of one kind of atom relative to the total number of atoms. In case the dopant substance is a compound, all the atoms of the dopant substance compound and introduced by the compound to the host material or substrate during the doping process are to be taken into account when calculating the atomic percent or atomic ratio. Alternatively, concentrations can be represented as molar percentages. The molecular equivalents of the atomic concepts are the molar fraction, or molar percent (which is molar fraction expressed with a denominator of 100). The molar fraction ($x_i$) is defined as unit of the amount of ith constituent (expressed in moles), $n_i$ divided by the total amount of all constituents (number of which is N) in a mixture or in a compound (also expressed in moles), $n_{tot}$. The following relations hold: $x_i=n_i/n_{tot}$ and $$n_{tot} = \sum_{i=1}^{N} n_i$$

Another scheme of stating the concentrations of dopants is to state the number of dopant atoms in some unit volume of the bulk, host or substrate material. Typical volume is one $cm^3$, for example dopant substance concentration in a bulk can be e.g. $3.5\times10^{15}/cm^3$.

In the present application, a "vapor phase deposition" means any coating method where the chemical substances or precursors causing the material under deposition to grow are supplied to the surface or surfaces under deposition in a vapor phase or in a gaseous phase for the purposes of growing deposits or film.

In the present application, a "stable oxide" is an oxide which is not reactive with the normal environment and in the normal temperature and pressure. A "stable oxide" may comprise silicon oxide, hafnium oxide or aluminium oxide.

In the present application, a "precursor for a stable oxide" is a precursor that can be utilised as a precursor or reactant in a vapor phase deposition of material or materials comprising the stable oxide. A precursor for a stable oxide may comprise a silicon precursor, a hafnium precursor or an aluminium precursor.

In the present application, a "silicon precursor" refers to any chemical substance that can be utilised as a precursor or reactant in a vapor phase deposition of material or materials comprising silicon. A silicon precursor may comprise following chemical substances: pure silanes, silane compounds, or silylamine compounds.

Pure silanes may comprise monosilane ($SiH_4$), disilane ($Si_2H_6$), or silane rings with more Si than one atoms, defined with the general formula $$Si_xH_y,$$

Silane compounds may comprise chemical substances defined with the general formula $$R_x\text{—}Si\text{—}H_{4-x},$$

where x can be varied from 0 to 4, and R can be e.g. an alkyl, an alkylamine, an alkoxide, a halide (F, Cl, Br, I), or a cyanate. In relation to silanes, R can vary heteroleptically.

Silylamine compounds comprise the general structure $$H_{3-y}\text{—}N\text{—}(R_x\text{—}Si\text{—}H_{3-x})_y,$$

where x can be varied from 0 to 3 and y can be varied from 1 to 3. Again, related to silylamine compounds, R can be an alkyl, an alkylamine, an alkoxide, a halide (F, Cl, Br, I), or cyanate. In relation to silylamines, R can vary heteroleptically. Examples of silylamine compounds are trisilylamine (TSA) and hexamethyldisilazane. In other words, silicon precursor may comprise trisilylamine (TSA) or hexamethyldisilazane. Silicon precursor may also comprise BDEAS (also called bis(diethylamino)silane), TEOS (also called tetraethyl orthosilicate), TDMAS (tris(dimethylamido)silanel, DIPAS (also called Di(isopropylamino)Silane), or BTBAS (also called bis(tertiary-butylamino)silane), or $SiH_2Cl_2$.

In the present application, a "phosphorous precursor" refers to any chemical substance that can be utilised as a precursor or reactant in a vapor phase deposition of material or materials comprising phosphorous. A "phosphorous precursor" may comprise a phosphine compound having a general structure $$R_x\text{—}PH_{3-x},$$

where x can be varied from 0 to 3. A phosphorous precursor may also comprise a phosphate compound having a general structure $R_x—PH_{3-x}O$, where x can be varied from 0 to 3.

Phosphorous precursor may comprise trimethylphosphate, triethylphophate, triisopropylphosphate, or tris(dimethylamido)phosphine. In relation to all phosphorous precursors mentioned above, R can be alkyl, halide, alkylamine, alkoxide or any combination thereof. In relation to phosphorous precursors, R may vary heteroleptically.

In the present application, an "arsenic precursor" refers to any chemical substance that can be utilised as a precursor or reactant in a vapor phase deposition of material or materials comprising arsenic. An "arsenic precursor" may comprise an arsine compound comprising a compound having a general structure $$R_x—AsH_{3-x},$$

where x can be varied from 0 to 3. In relation to arsenic precursors, R can be alkyl, halide, alkylamine, alkoxide, alkylsilyl or combinations thereof. In relation to arsenic precursors, R also may vary heteroleptically. Examples of arsenic-hydrogen compounds are $AsH_3$, $As(NMe_2)_3$ or $As(SiEta)_3$. In other words, an arsenic precursor may comprise $AsH_3$, $As(NMe_2)_3$ or $As(SiEt_3)_3$. Arsenic-hydrogen compound may also comprise arsane. Arsenic precursor may be also comprise elemental As.

In the present application, an "boron precursor" refers to any chemical substance that can be utilised as a precursor or reactant in a vapor phase deposition of material or materials comprising boron. A boron precursor may comprise a borane compound with a general formula $$R_x—BH_{3-x},$$

where x can be varied from 0 to 3.

Boron precursor may comprise a dimeric boron compound. Dimeric boron compound may comprise $B_2H_6$ or $B_2F_4$.

Boron precursor may comprise a borate compound with a general formula $$R_x—BH_{3-x}O,$$

where x can be varied from 0 to 3. Related to boron precursors and their general formulas, R can be alkyl, halide, alkylamine, alkoxide or combinations thereof. Related to boron precursors, R can vary heteroleptically. Boron precursor may comprise BBr3, trimethylborate, triisopropylborate or tris(dimethylamido) borane.

In the present application, an "antimony precursor" refers to any chemical substance that can be utilised as a precursor or reactant in a vapor phase deposition of material or materials comprising antimony. An antimony precursor may comprise triphenylantimony or tris(dimethylamido)antimony.

In the present application, an "aluminium precursor" refers to any chemical substance that can be utilised as a precursor or reactant in a vapor phase deposition of material or materials comprising aluminum. An aluminium precursor may comprise the following compounds: $Al(CH_3)_3$ (trimethyl-aluminium), AlCl3 (aluminium tri-chloride), Al(OiPr)3 (aluminium isopropoxide) or Al(NMe2)3 (tris(dimethylamido)aluminium(III)).

In the present application, a "hafnium precursor" refers to any chemical substance that can be utilised as a precursor or reactant in a vapor phase deposition of material or materials comprising hafnium. A hafnium precursor may comprise the following compounds: $HfCl_4$, $Hf(NEtMe)_4$, $Hf(NMe_2)_4$, or $Hf(Cp)(NMe_2)_3$.

Throughout the present application, in chemical formulas, "Et" means ethyl, "Me" means methyl, and "Cp" means cyclopentadienyl.

In the present application, an "oxidising precursor" refers to any chemical substance that can be utilised as a precursor or reactant in a vapor phase deposition of material or materials comprising oxygen. In particular, an "oxidising precursor" means a chemical substance that can turn another precursor with which the oxidising precursor reacts with into an oxide during a vapor-phase deposition process like the atomic layer deposition method (ALD). An oxidising precursor may comprise ozone ($O_3$), water ($H_2O$), oxygen plasma (which is plasma comprising oxygen in some ionized state), $CO_2$ (carbon dioxide), or $H_2O_2$ (hydrogen peroxide), or any combination thereof arranged as a mixture to the deposition tool in the same precursor feeding instant, e.g. precursor pulse in ALD or a continuous feeding of the precursor in case of CVD.

In the present application, when a first precursor and a second precursor are defined by referring to a group of two precursors, the first precursor and the second precursor are not the same precursor. Similarly, in the present application, when a third precursor and a fourth precursor are defined by referring to a group of two precursors, the third precursor and the fourth precursor are not the same precursor. In other words, when a first precursor is selected from the group of a precursor PRE1 and a precursor PRE2, and a second precursor is the other from the group of a precursor PRE1 and a precursor PRE2, PRE1 is not the same precursor as PRE2. Similarly, when a third precursor is selected from the group of a precursor PRE3 and a precursor PRE4, and a fourth precursor is the other from the group of a precursor PRE3 and a precursor PRE4, PRE3 is not the same precursor as PRE4.

BRIEF DESCRIPTION OF THE DRAWINGS

The invention is described in detail by means of specific embodiments with reference to the enclosed drawings, in which.

It is to be emphasised that in FIGS. 1-8*b* are schematic in nature, and the dimensions of the illustrated structures, especially the dimensions of the thin film thicknesses vs. the dimensions of the substrate are exaggerated for illustrative clarity.

DETAILED DESCRIPTION OF THE INVENTION

Figure 1:
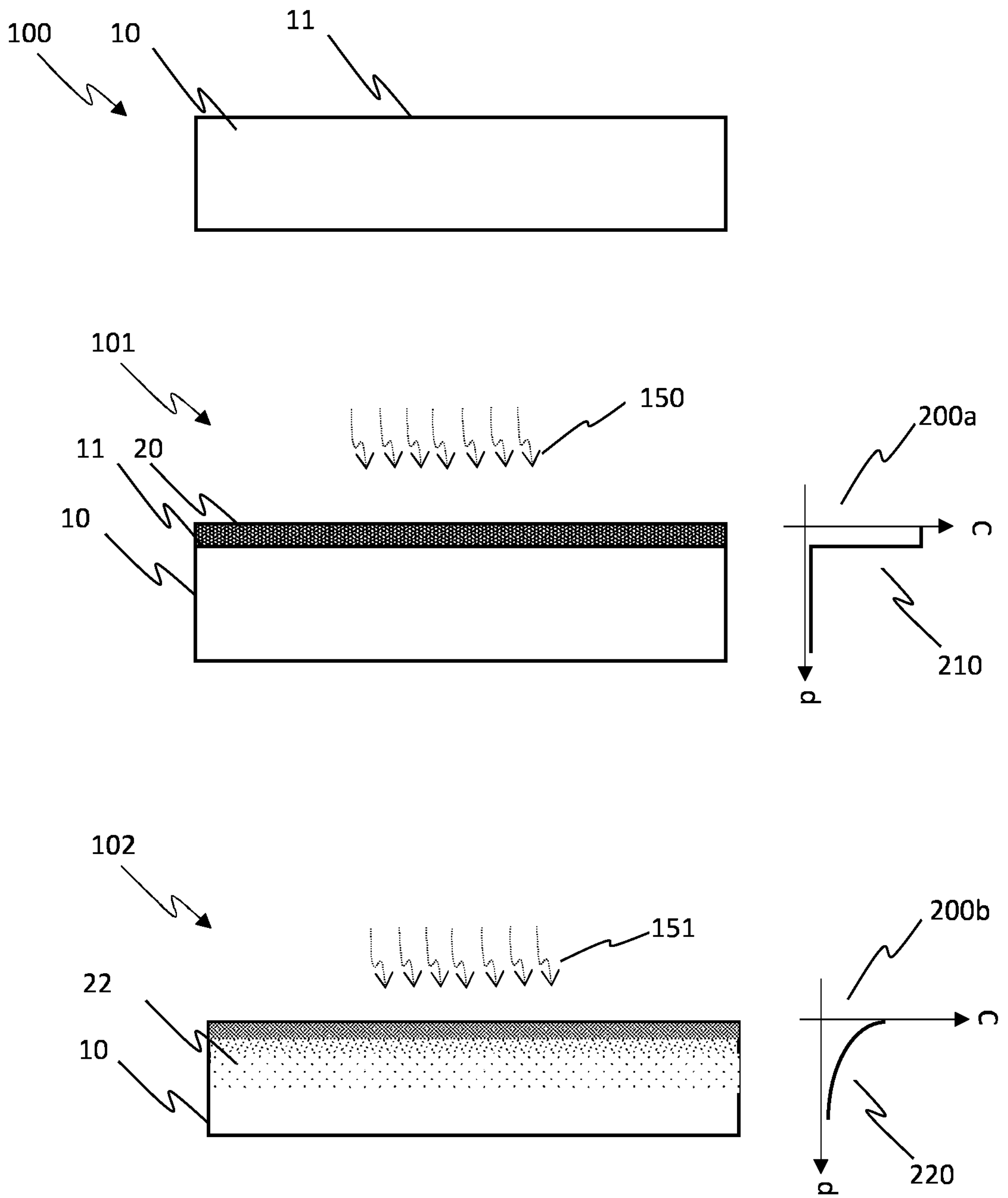
FIG. 1 shows schematics of a prior art diffusion doping method.

In the following description, like labels (e.g. 101*b*) or numbers (e.g. 200) denote like elements. In addition, the following definitions are made:

FIG. 1 shows a prior art method for doping a semiconductor substrate. In FIG. 1, in step 100, semiconductor substrate 10, for example a substrate of single crystal silicon is provided. In dopant layer deposition step 101, a deposition method 150 like chemical vapor deposition (CVD) or atomic layer deposition (ALD) is used to deposit a dopant source layer 20 of thickness of some to tens of nanometres, for example 1 nm-20 nm, on the substrate 10. The dopant source layer comprises the dopant substance or dopant substances, and thus, after the step 101, the relative concentration 210 of the dopant substance is shown schematically in graph 200*a* with a step-like function of rich concentration of dopant substance or dopant substances and then, in the depth direction perpendicular to the surface, no or very small amounts of dopant substance or dopant substances.

In an annealing step 102, an annealing method 151 like arranging an elevated temperature to the substrate 10 and layer 20 is used to drive at least some of the atoms of the dopant source layer 20 into the substrate 10, markedly changing the concentration distribution from a step-like function into a downward sloping curve 220 depicting the relative concentration of the dopant substance in graph 200*b*, incorporating at least of portion of the dopant substances of the dopant source layer 20 into the substrate 10, marked with a fading dotted pattern 22 in step 102. Advantageous elevated temperature for the annealing step 102 is 800° C.-1100° C., more preferably 850° C.-1000° C. and most preferably 900° C.-950° C.

Figure 2A:
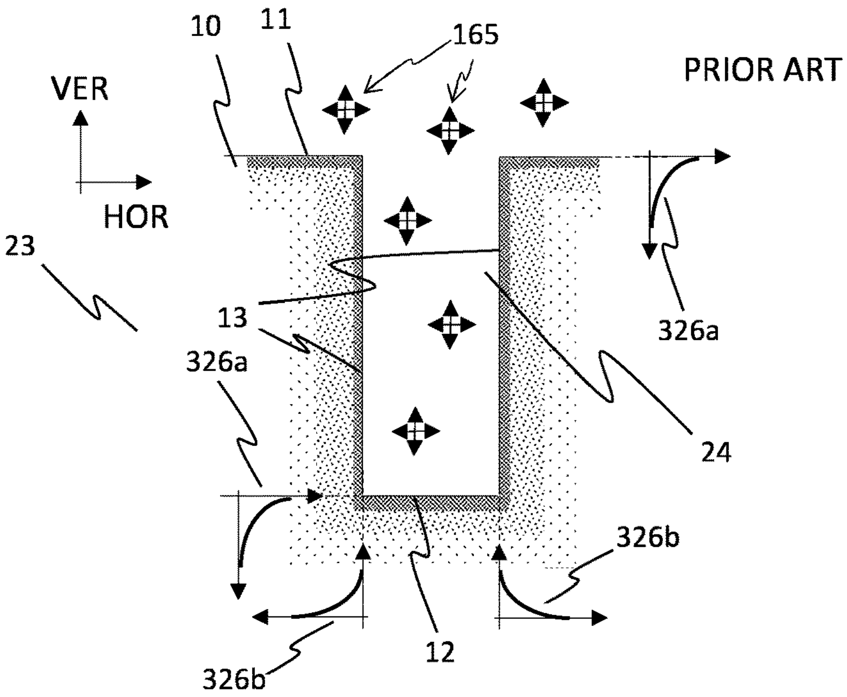
FIGS. 2*a* and 2*b* show the characteristics of prior art diffusion and ion implantation doping methods, respectively, with relation to so-called high aspect ratio structures.

FIG. 2*a* shows a schematic representation of a prior art diffusion doping result into a substrate 23. The substrate 23 comprises a surface 11. The substrate has one or more three-dimensional (3D) features 24 that also extend to the depth direction of the substrate surface, perpendicular to the substrate surface. A substrate can comprise many 3D structures or 3D features 24 of different shapes and sizes. The 3D feature 24 comprises wall or walls 13 and a bottom 12.

The 3D features 24 can be e.g. trenches that, when filled with suitable materials in the semiconductor manufacturing processes, for example isolate and/or insulate two areas of semiconductors from one another. Symbols 165 denote the diffusive nature of the movement of the one or more dopant substances close to a three-dimensional structure in a semiconductor substrate. The dopant concentration depth profiles 326*a* and 326*b* are very similar owing to the isotropic nature of the diffusion doping in both horizontal and vertical segments of the doped structure surfaces. In other words, diffusion doping can provide an uniform doping on the surface 11 of the substrate and on the walls 13 and bottom 12 of the 3D feature in the substrate with essentially same concentration at the surface 11, and the bottom 12 and at the walls 13.

Figure 2B:
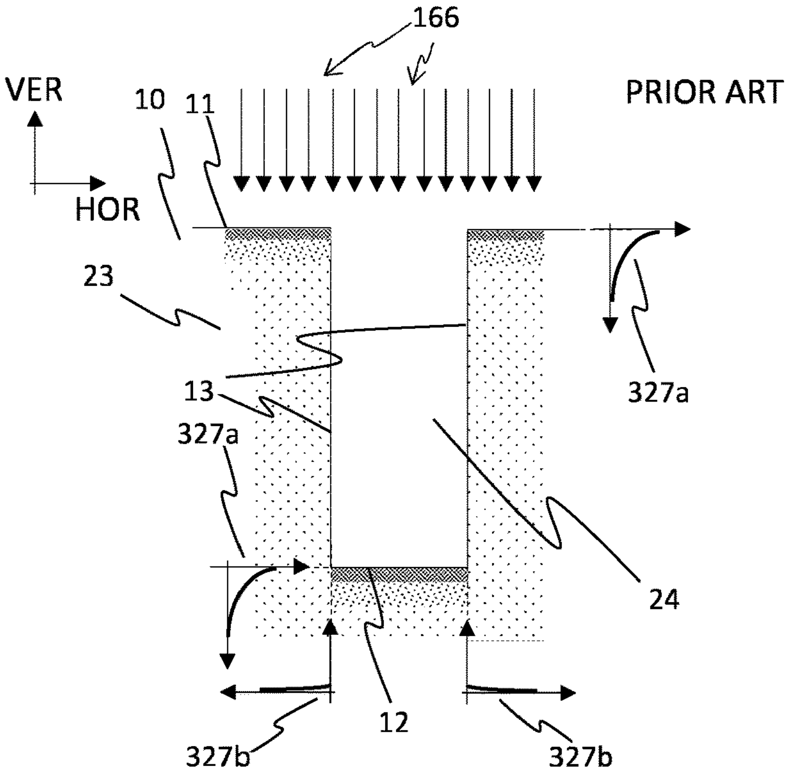

FIG. 2*b* shows a schematic representation of a prior art ion implantation doping result. Symbols 166 denote the directed, anisotropic nature of the movement or bombardment of the substrate by the dopant substance. The surfaces of the substrate that are perpendicular to the direction of the movement of the dopant substance receive considerably larger dose of dopant substance or substances, denoted with doping concentration distribution 327*a*, than the surfaces that are parallel to the bombardment, denoted with doping concentration distribution 327*b*.

Figure 3:
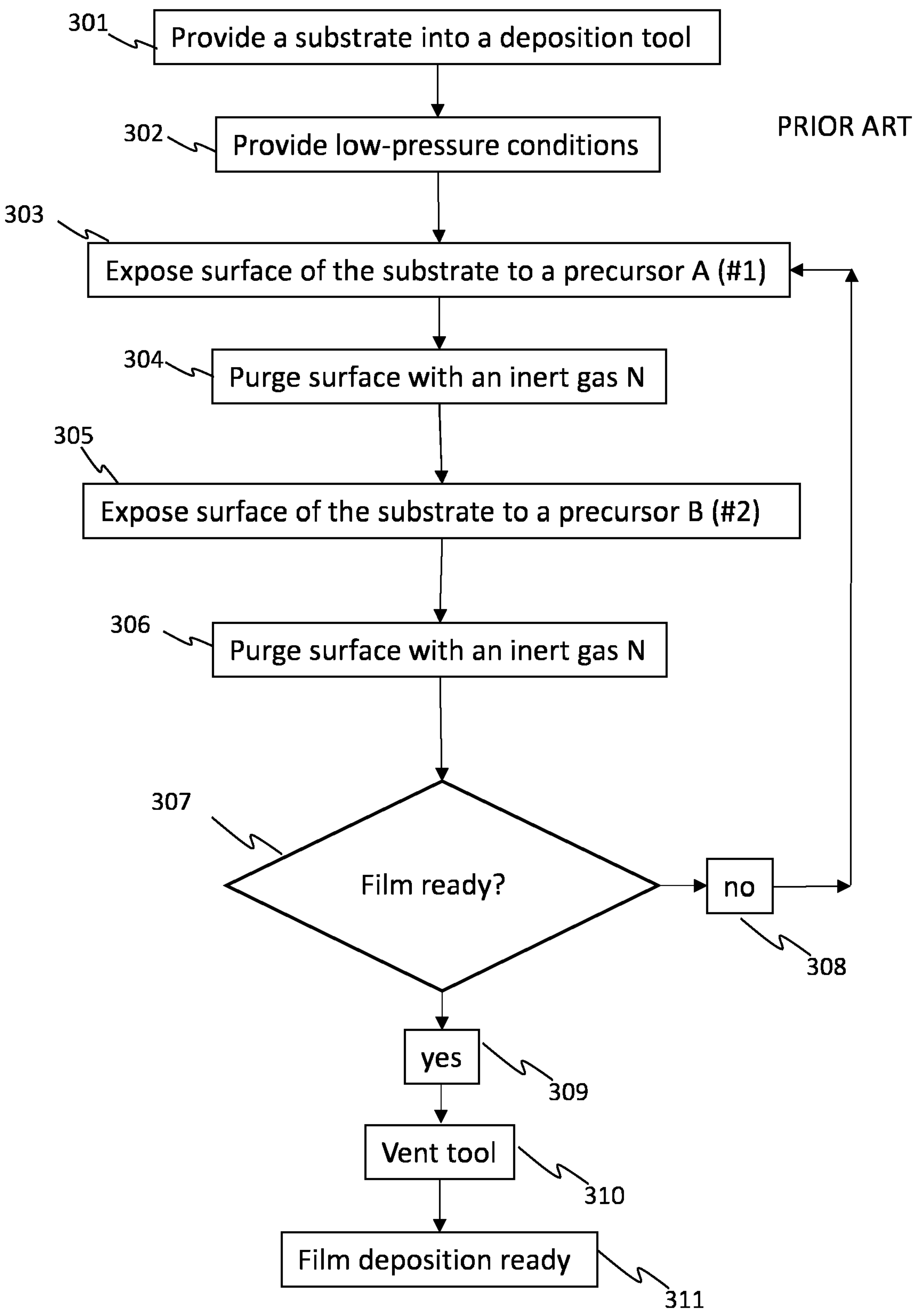
FIG. 3 shows the basic prior art process steps in an atomic layer deposition method when a single material film is grown.

FIG. 3 shows the steps of a prior art vapor-phase deposition method, the atomic layer deposition method (also called the ALD method or ALD for short), where a film or a layer of material or at least patches of deposit is deposited on the surface of a substrate using two precursors A (also called the first precursor, #1) and B (also called the second precursor, #2). In the loading step 301 or initial step 301, the deposition tool is loaded with one or more substrates. This may mean, for example, placing the substrates on a rack or racks of a reaction chamber, which is then placed into the vacuum chamber of the ALD deposition tool. In evacuation step 302, the vacuum chamber is evacuated of the ambient air, generating a vacuum or low-pressure condition where the pressure in the vacuum chamber is for example 1 mbar-10 mbar, for example 2 mbar. At the same time, the vacuum chamber temperature is elevated, also elevating the temperature of the reaction chamber and the substrates therein. For deposition, temperatures in the range of 100° C.-800° C., more preferably 200° C.-500° C. and most preferably 250° C.-400° C. are advantageous. In ALD, it is important to keep the temperature range such that the supplied reactants or precursors remain in vapor phase (implying high enough temperature), but do not yet decompose (which would be indicative of too high temperature).

In first precursor exposure step 303, as precursor A or as the first precursor, e.g. TMA (tri-methyl-aluminium) is introduced to the reaction chamber and by the same token, on the surfaces of the one or more substrates where it chemisorbs on the surfaces. In first purge step 304, the reaction chamber is purged with a gas which is inert in relation to the reactions and substances growing the film, for example nitrogen, argon or helium. First purge step 304 sweeps away excess molecules or atoms of precursor A from the surfaces of the substrate or substrates, but also from the surfaces of most of the conduits and valves required to feed and regulate the flows of the precursors. In second precursor exposure step 305, precursor B or second precursor, e.g. water vapor, is introduced to the reaction chamber. Precursor B is chemisorbed on the surfaces of the substrates, already having a monolayer of precursor A present, causing precursors A and B react, finally giving rise to the growth of film on the surface. For example, in case of TMA and water vapor, the growing film is essentially aluminium oxide, $Al_2O_3$. Second purge step 306 sweeps away excess molecules or atoms of precursor B from the surfaces of the substrate or substrates. Steps 304 and 306 can be identical, e.g. use same purge gas for the same duration.

In film thickness determination step 307, it is determined if the film deposited on the surface or surfaces is suitably thick or otherwise ready. This can be done a priori by setting the number of deposition cycles that are to be carried out. In other words, the film thickness determination step may comprise counting the number of cycles NS needed to reach a certain thickness of film. One deposition cycle may comprise first precursor exposure step 303, first purge step 304, second precursor exposure step 305 and second purge step 306. Film thickness determination step can also comprise measuring the thickness of the deposited film e.g. optically. If the film is not ready, denoted by decision 308, (not enough deposition cycles are carried out), steps 303-306 are repeated to grow more film. If film, on the other hand, is ready, denoted with a decision 309, the tool can be vented and cooled down to a temperature where the reaction chamber and the one or more substrates can be taken out of the deposition tool in a post-deposition step 310. Alternate to venting and cooling down, the process parameters (e.g. temperature) are changed and/or the precursors are changed to grow another type of film on the film just deposited. In completion step 311, the deposition is completed and the substrates with the deposited film on them can be processed or examined further.

In addition to an elevated temperature, plasma generated for example with capacitive or inductive plasma generation devices can also be provided to the surface or near the surface of the substrate to promote the reactions needed to grow film (this step not shown). Precursor A (first precursor) or precursor B (second precursor) can also comprise plasma.

Figure 4A:
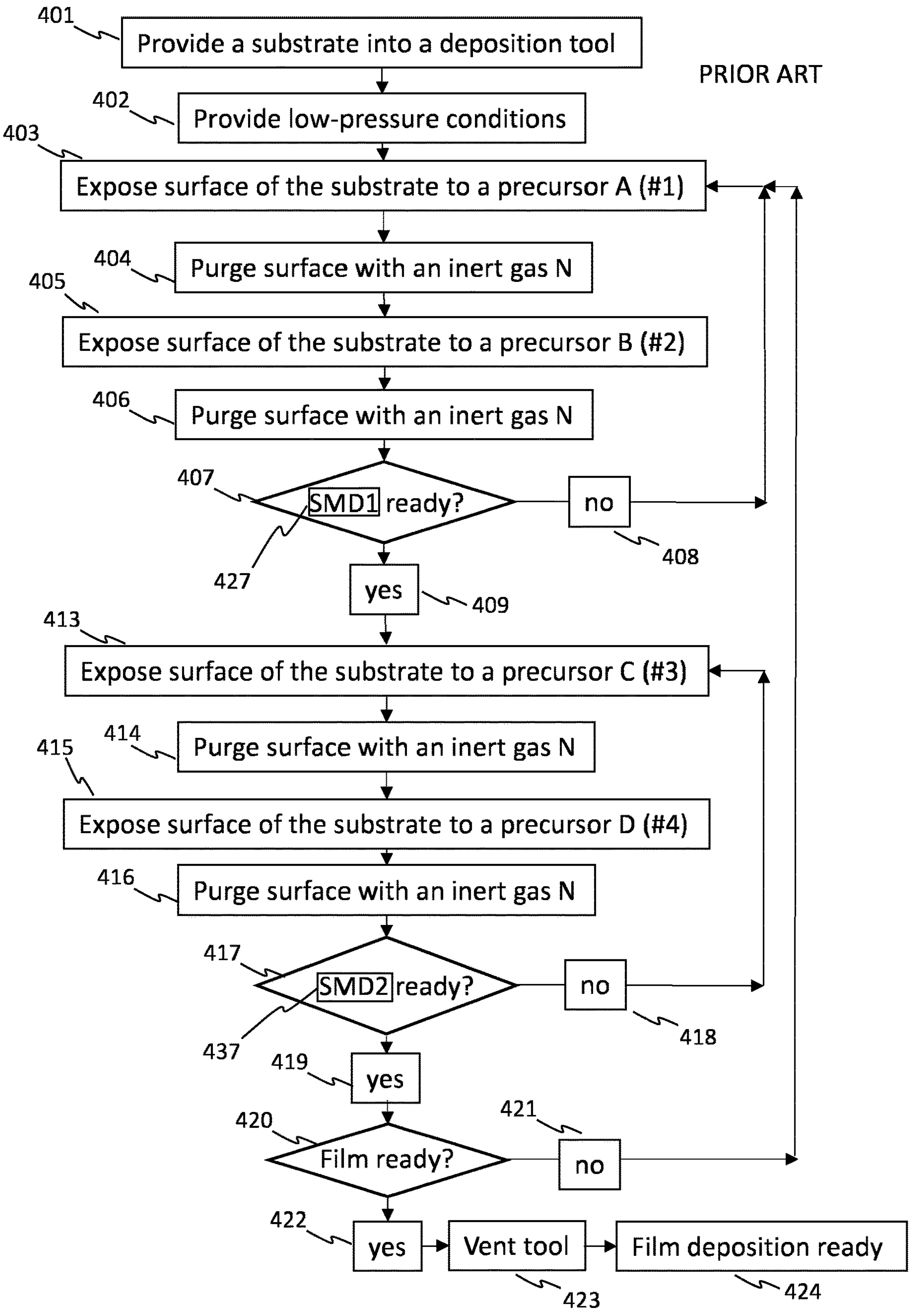
FIG. 4*a* shows the basic prior art process steps where a nanolaminate structure or a mixture material film of two different sub-materials is grown with the atomic layer deposition method.

FIG. 4*a* shows an example process of a prior art atomic layer deposition method, where a film or a layer of mixture material is deposited using four precursors A (also called the first precursor #1), B (also called the second precursor #2), C (also called the third precursor #3) and D (also called the fourth precursor #4). SMD1 and SMD2 refer to first sub-material deposition and second sub-material deposition, respectively. SMD1 and SMD2 also refer to first sub-material deposit and second sub-material deposit, respectively. Sub-material deposition cycles 1 (steps 403-406) and 2 (steps 413-416) correspond to the film growing cycle 303-306 in FIG. 3, but have distinct precursors A-D and other distinct process parameters like deposition temperature, exposure times of the coated objects or substrates to the precursors A-D, purge times, vacuum pressure in the vacuum and reaction chambers etc. Sub-material deposition cycle 1 and sub-material deposition cycle 2 may be repeated until a film or layer of required thickness is grown. This film is a mixture material film, and the material therein is mixture material.

In more detail, FIG. 4*a* shows the steps of a prior art vapor-phase deposition method, the atomic layer deposition method or the ALD method, where a film or a layer of material or at least patches of deposit is deposited on the surface of a substrate using four precursors, A (also called the first precursor) and B (also called the second precursor) to deposit the first sub-material, and C (also called the third precursor) and D (also called the fourth precursor) to deposit the second sub-material. As indicated above, first and second sub-material depositions may be repeated until a mixture material film of suitable thickness is achieved.

In the loading step 401 or initial step 401, the deposition tool is loaded with one or more substrates. This may mean, for example, placing the substrates on a rack or racks of a reaction chamber, which is then placed into the vacuum chamber of the ALD deposition tool. In evacuation step 402, the vacuum chamber is evacuated of the ambient air, generating a vacuum or low-pressure condition where the pressure in the vacuum chamber is for example 1 mbar-10 mbar, for example 2 mbar. At the same time, the vacuum chamber temperature is elevated, also elevating the temperature of the reaction chamber and the substrates therein. For deposition, temperatures in the range of 100° C.-800° C., more preferably 200° C.-500° C. and most preferably 250° C.-400° C. are advantageous. In ALD, it is important to keep the temperature range such that the supplied reactants or precursors remain in vapor phase (implying high enough temperature), but do not yet decompose (which would be indicative of too high temperature).

To deposit the first sub-material (SMD1), in first precursor exposure step 403, as precursor A or as the first precursor, e.g. TMA (tri-methyl-aluminium) is introduced to the reaction chamber and by the same token, on the surfaces of the one or more substrates where it chemisorbs on the surfaces. In first purge step 404, the reaction chamber is purged with a gas which is inert in relation to the reactions and substances growing the film, for example nitrogen, argon or helium. First purge step 404 sweeps away excess molecules or atoms of precursor A from the surfaces of the substrate or substrates, but also from the surfaces of most of the conduits and valves required to feed and regulate the flows of the precursors. In second precursor exposure step 405, precursor B or second precursor, e.g. water vapor, is introduced to the reaction chamber. Precursor B is chemisorbed on the surfaces of the substrates, already having a monolayer of precursor A present, causing precursors A and B react, finally giving rise to the growth of film or a patch of film on the surface. For example, in case of TMA and water vapor, the deposited film is essentially aluminium oxide, $Al_2O_3$. Second purge step 406 sweeps away excess molecules or atoms of precursor B from the surfaces of the substrate or substrates. Steps 404 and 406 can be identical, e.g. use same purge gas for the same duration.

In first sub-material related film thickness determination step 407, it is determined if the first sub-material deposit or film deposited on the surface or surfaces is suitably thick or otherwise ready. This can be done a priori by setting the number of deposition cycles that are to be carried out. In other words, the first sub-material related film thickness determination step may comprise counting the number of cycles NS1 needed to reach a certain thickness of film. One deposition cycle related to the first sub-material deposition comprises first precursor exposure step 403, first purge step 404, second precursor exposure step 405 and second purge step 406. Film thickness determination step can also comprise measuring the thickness of the deposited film e.g. optically. If the film is not ready, denoted by decision 408, (not enough deposition cycles are carried out), steps 403-406 are repeated to grow more film or deposit of the first sub-material. If the film is ready, determined by the decision 409, a deposit, a patch, or a film of the first sub-material 427 (SMD1) is deposited. Thus, deposition of the second sub-material may start.

To deposit the second sub-material (SMD2), in third precursor exposure step 413, as precursor C or as the third precursor, e.g. TiCl4 (titanium tetrachloride) is introduced to the reaction chamber and by the same token, on the surfaces of the one or more substrates where it chemisorbs on the surfaces. In the third purge step 414, the reaction chamber is purged with a gas which is inert in relation to the reactions and substances growing the film, for example nitrogen, argon or helium. Third purge step 414 sweeps away excess molecules or atoms of precursor C from the surfaces of the substrate or substrates, but also from the surfaces of most of the conduits and valves required to feed and regulate the flows of the precursors. In fourth precursor exposure step 415, precursor D or fourth precursor, e.g. water vapor, is introduced to the reaction chamber. Precursor D is chemisorbed on the surfaces of the substrates, already having a monolayer of precursor C present, causing precursors C and D react, finally giving rise to the growth of film or a patch of film on the surface. For example, in case of $TiCl4$ and water vapor, the growing film is essentially titanium dioxide, $TiO2$. Fourth purge step 416 sweeps away excess molecules or atoms of precursor D from the surfaces of the substrate or substrates. Steps 414 and 416 can be identical, e.g. use same purge gas for the same duration.

In second sub-material related film thickness determination step 417, it is determined if the second sub-material deposit or film deposited on the surface or surfaces is suitably thick or otherwise ready. This can be done a priori by setting the number of deposition cycles that are to be carried out. In other words, the film thickness determination step may comprise counting the number of cycles NS2 needed to reach a certain thickness of film. One deposition cycle related to the second sub-material comprises third precursor exposure step 413, third purge step 414, fourth precursor exposure step 415 and fourth purge step 416. Second sub-material related film thickness determination step can also comprise measuring the thickness of the deposited film e.g. optically. If the film is not ready, denoted by decision 418, (not enough deposition cycles are carried out), steps 413-416 are repeated to grow more film or deposit of the second sub-material. If the film is ready, a deposit, a patch, or a film of the second sub-material 437 is deposited.

If the second sub-material film deposition SMD2, is ready, denoted with a decision 419, determination if the entire film is ready is to be made in step 420. This determination can again be made by counting the total number of deposition cycles of the first and second sub-materials, respectively, that is, value of NS1+NS2. Alternatively, the readiness of SMD1 and SMD2 can be determined by observing e.g. the optical properties of the sub-material deposition 1 and sub-material deposition 2 especially if a nanolaminate structure is deposited. If the film is not ready, indicated with decision 421 (no), the method is continued from step 403 related to the deposition of the first sub-material. If the film is ready, indicated by decision 422, the tool is vented (step 423) and the mixture material and related mixture material film deposition is ready (step 424) and the one or more substrates with the deposited film on them can be processed or examined further.

In other words, sub-material deposition 1 and sub-material deposition 2 may be a deposit of a distinct film of sub-material 1 and sub-material 2, for which usually several, usually above 10 ALD cycles are needed of precursors A (first precursor) and B (second precursor) (for sub-material 1) or C (third precursor) and D (fourth precursor) (for sub-material 2). This yields a so-called nanolaminate.

Alternatively, a sub-material deposition 1 or 2 can only comprise few, at minimum one cycle of precursors A (first precursor) and B (second precursor), and minimum of one cycle of precursors C (third precursor) and D (fourth precursor). In this case, no distinct sub-material film is yet able to grow, but instead the material forms islands or patches of growth, effectively mixing the two sub-materials 1 and 2 together to a solid layer of intermixed film.

As indicated above, precursor A is also called the first precursor, precursor B the second precursor, precursor C the third precursor, and precursor D the fourth precursor.

FIG. **4*b*** shows an example process of a prior art atomic layer deposition method, where a film or a layer of mixture material is deposited using three precursors A (also called the first precursor #1), B (also called the second precursor #2), and C (also called the third precursor #3). SMD1 refers to first sub-material deposition.

Figure 4B:
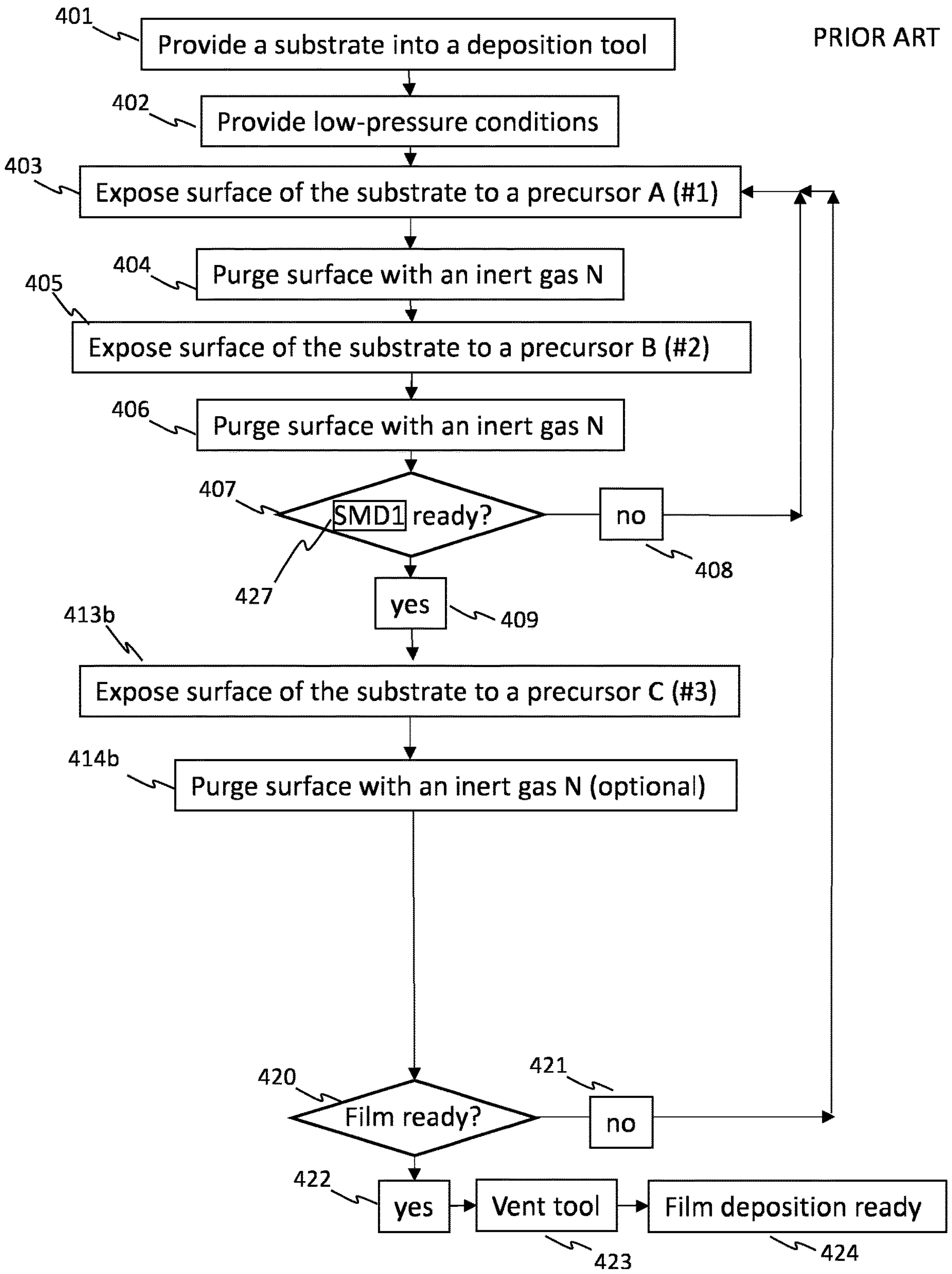
FIG. 4*b* shows the basic prior art process steps where a mixture material film is grown, based on first depositing a first sub-material and then intermixing the first sub-material with a third precursor with the atomic layer deposition method.

Sub-material deposition cycles 1 (steps 403-406) and steps 401, 402, 407, 408 and 409 are identical to FIG. **4*a* in FIG. 4*b*. However, in step 413*b*, the surface of the substrate is exposed to precursor C e.g. with one pulse of precursor C into the reaction area or reaction chamber of the deposition tool, but after this not to precursor D. If precursor C is the dopant precursor, dopant substances are introduced to the layer or film grown according to the steps 403-408 in FIG. 4*b*, and subsequently become intermixed with the first sub-material deposit SMD1, 427. Excess precursor C may be purged from the surface of the substrate in the third purge step 414*b*. Alternatively, the third purge step 414*b* can be omitted, and thus there is no third purge step 414*b***.

Also steps 420-424 are identical to FIG. **4*a* in FIG. 4*b***. Thus, an intermixed mixture material film is grown, and the intermixed mixture material is a mixture material.

An intermixed mixture material may mean either patches or islands of the at least two distinct materials that are grown according to FIG. **4*a* to a distinct layer or film of material, or an intermixed film which is grown according to the steps shown in FIG. 4*b***. Nanolaminates, intermixed films and films that comprise both nanolaminates and intermixed films are generally called mixture materials in the present application, and a layer of mixture material is called a mixture material layer. When a mixture material comprises a dopant substance, the mixture material layer is called the mixture material source layer (source being the source of dopants diffused to the surrounding layers in one or more annealing steps according to the invention or its embodiments). Thus, generalising, in the present application, the mixture material is arranged by using at least three distinct precursors in the vapour phase deposition process (like CVD or ALD) of the mixture material, for example a first precursor and a second precursor to grow a film and then arranging a third precursor to the deposition process to arrange a mixture material and to alter the properties of the film grown.

Figure 5:
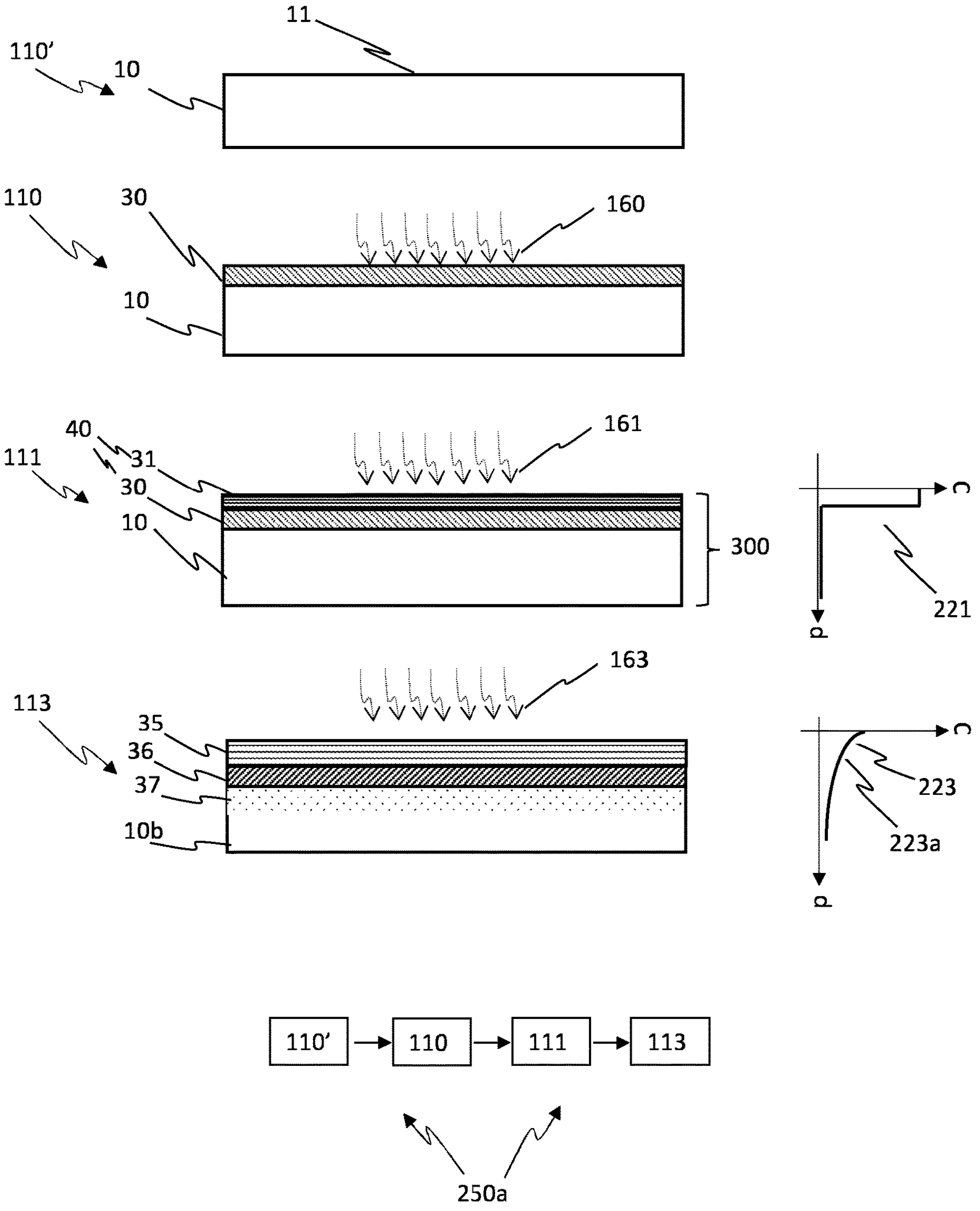
FIG. 5 shows schematics of the steps of a method according to an embodiment of the present invention.

FIG. 5 shows an aspect of the present invention, a method for doping a semiconductor. The method comprises an initial step where a semiconductor substrate comprising a surface is placed into a deposition tool. The method comprises, in the following order, the steps of a) depositing a separation layer 30 on the surface of a substrate 11 in a separation layer deposition step 110, in which a separation layer 30 is deposited on the surface 11 of a substrate 10, b) depositing a mixture material source layer 31 in a mixture material source layer deposition step 111, in which a mixture material source layer 31 comprising a mixture material is deposited on the separation layer 30, the mixture material of the mixture material source layer comprising a dopant substance, and c) annealing the substrate 10, the separation layer 30, and the mixture material source layer 31 in an annealing step 113, in which the substrate 10, the separation layer 30, and the mixture material source layer 31 are heated to an elevated temperature to arrange diffusion of dopant substance from the mixture material source layer 31 to the substrate 10 and to the separation layer 30, 36.

In the method according to an embodiment of the invention in FIG. 5, the initial step 110' of providing a semiconductor may comprise placing one or more semiconductor substrates into a deposition tool like an ALD tool or a CVD tool.

In the separation layer deposition step 110, a separation layer 30 is deposited on the surface 11 of a substrate 10 with a deposition treatment 160. Separation layer deposition step 110 may be deposited e.g. according to the principles of chemical vapor deposition (CVD), or in particular, the separation layer deposition step 110 may be deposited with an atomic layer deposition method, the process and steps of which are discussed in detail with reference to FIG. 3, FIG. 4*a* and FIG. 4*b*.

When using an atomic layer deposition method as the deposition method of the separation layer deposition step 110, the separation layer deposition step 110 may be deposited with a first precursor comprising a precursor for a stable oxide, and a second precursor comprising an oxidizing precursor. In particular, when using an atomic layer deposition method as the deposition method of the separation layer deposition step 110, the separation layer deposition step 110 may be deposited with a first precursor comprising a silicon precursor, and a second precursor comprising an oxidizing precursor. First precursor (precursor A) and second precursor (precursor B) are defined in conjunction with FIG. 3 above.

When using an atomic layer deposition method as the deposition method of the separation layer deposition step 110, the separation layer deposition step 110 may also be deposited with a first precursor being selected from the group of a precursor for a stable oxide and an oxidising precursor, and a second precursor being the other from the group of a precursor for a stable oxide and an oxidising precursor. The atomic layer deposition of the separation layer deposition step 110 may also be deposited with a first precursor being selected from the group of a silicon precursor and an oxidising precursor, and a second precursor being the other from the group of a silicon precursor and an oxidising precursor. First precursor (precursor A) and second precursor (precursor B) are defined in conjunction with FIG. 3 above.

The atomic layer deposition method of the separation layer deposition step 110 may be arranged to deposit a separation layer 30 of a thickness of 0.5 nm-15 nm, 1 nm-5 nm or 2 nm-3 nm.

The mixture material source layer deposition step 111 may also be deposited with the atomic layer deposition method. The mixture material source layer deposition step 111 may also be deposited with other thin film deposition method like CVD or sputtering or other deposition treatment 161. Mixture material source layer comprises a mixture material.

Still referring to FIG. 5, in an embodiment, the atomic layer deposition of the mixture material source layer deposition step may be arranged to deposit a mixture material deposited with a first precursor comprising a precursor for a stable oxide, arranged to deposit a first sub-material, a second precursor comprising an oxidizing precursor, arranged to deposit a first sub-material, a third precursor comprising a dopant precursor, arranged to deposit a second sub-material, and a fourth precursor comprising an oxidizing precursor, arranged to deposit a second sub-material. The flow of the ALD process is defined in FIG. 4*a*, with precursor A as the first precursor, with precursor B as the second precursor, with precursor C as the third precursor, and with precursor D as the fourth precursor.

More specifically, in an embodiment, the atomic layer deposition of the mixture material source layer deposition step 111 arranged to deposit a mixture material may be deposited with a first precursor comprising a silicon precursor, arranged to deposit a first sub-material, and a second precursor comprising an oxidizing precursor, arranged to deposit a first sub-material, a third precursor comprising a dopant precursor, arranged to deposit a second sub-material, and a fourth precursor comprising an oxidizing precursor arranged to deposit a second sub-material. Again, the flow of the ALD process is defined in FIG. 4*a*, with precursor A as the first precursor, with precursor B as the second precursor, with precursor C as the third precursor, and with precursor D as the fourth precursor.

More specifically, in an embodiment, the atomic layer deposition of the mixture material source layer deposition step 111 arranged to deposit a mixture material is deposited with a first precursor being selected from the group of a precursor for a stable oxide and an oxidising precursor, arranged to deposit a first sub-material 427, a second precursor being the other from the group of a precursor for a stable oxide and an oxidising precursor, arranged to deposit a first sub-material 427, and a third precursor being selected from the group of a dopant precursor and an oxidising precursor, arranged to deposit a second sub-material 437, and a fourth precursor being the other from the group of a dopant precursor and an oxidizing precursor, arranged to deposit a second sub-material 437. Again, the flow of the ALD process is defined in FIG. 4*a*, with precursor A as the first precursor, with precursor B as the second precursor, with precursor C as the third precursor, and with precursor D as the fourth precursor.

In another embodiment, the atomic layer deposition of the mixture material source layer deposition step 111 arranged to deposit a mixture material is deposited with a first precursor being selected from the group of a silicon precursor and an oxidising precursor, arranged to deposit a first sub-material 427, a second precursor being the other from the group of a silicon precursor and an oxidizing precursor, arranged to deposit a first sub-material 427, and a third precursor being selected from the group of a dopant precursor and an oxidising precursor, arranged to deposit a second sub-material 437, a fourth precursor being the other from the group of a dopant precursor and an oxidizing precursor, arranged to deposit a second sub-material 437. Again, the flow of the ALD process is defined in FIG. 4*a*, with precursor A as the first precursor, with precursor B as the second precursor, with precursor C as the third precursor, and with precursor D as the fourth precursor.

In another embodiment, the atomic layer deposition of the mixture material source layer deposition step may be arranged to deposit a mixture material with a first precursor comprising a precursor for a stable oxide, arranged to deposit a first sub-material 427, and a second precursor comprising an oxidizing precursor, arranged to deposit a first sub-material 427, and a third precursor comprising a dopant precursor, the third precursor arranged to introduce dopants to the first sub-material 427 to arrange a mixture material of the mixture material source layer 31 from the first sub-material. The steps of the ALD method related to this embodiment are illustrated in relation to FIG. 4*b* above.

In another embodiment, the atomic layer deposition of the mixture material source layer deposition step may be arranged to deposit a mixture material with a first precursor comprising a silicon precursor, arranged to deposit a first sub-material 427, and a second precursor comprising an oxidizing precursor, arranged to deposit a first sub-material 427, and a third precursor comprising a dopant precursor, the third precursor arranged to introduce dopants to the first sub-material 427 to arrange a mixture material of the mixture material source layer 31 from the first sub-material 427. The steps of the ALD method related to this embodiment are also illustrated in relation to FIG. 4*b* above.

In another embodiment, the atomic layer deposition of the mixture material source layer deposition step may be arranged to deposit a mixture material with a first precursor being selected from a group of a precursor for a stable oxide and an oxidising precursor, arranged to deposit a first sub-material 427, a second precursor being the other from a group of a precursor for a stable oxide and an oxidising precursor, arranged to deposit a first sub-material 427, and a third precursor being a dopant precursor, arranged to introduce dopants to the first sub-material 427 to arrange a mixture material of the mixture material source layer 31 from the first sub-material 427.

In yet another embodiment, the atomic layer deposition of the mixture material source layer deposition step may be arranged to deposit a mixture material with a first precursor being selected from the group of a silicon precursor and an oxidising precursor, arranged to deposit a first sub-material 427, a second precursor being the other from the group of a silicon precursor and an oxidising precursor, arranged to deposit a first sub-material 427, and a third precursor being a dopant precursor, arranged to introduce dopants to the first sub-material 427 to arrange a mixture material of the mixture material source layer 31 from the first sub-material 427.

In an embodiment, the atomic layer deposition method of the mixture material source layer deposition step 111 may be arranged to deposit a mixture material source layer 31 of a thickness of 0.1 nm-5 nm, more preferably 0.2 nm-2 nm or most preferably 0.4 nm-1.0 nm.

In an embodiment, the atomic layer deposition method of the mixture material source layer deposition step may be arranged to deposit a mixture material source layer comprising a mixture material. Again, the arrangement for depositing a mixture material is specified in detail above in relation to FIG. 4*a* or FIG. 4*b*. The deposition of the mixture material source layer may be arranged to comprise the precursor comprising the dopant substance. The atomic ratio of the dopant substance in the deposited mixture material source layer is arranged to be 0.001 at. %-10 at. %; or more preferably 0.01 at. %-1 at. %; or most preferably 0.05 at. %-0.5 at. %. Noteworthy is that that the resulting concentration of the dopant substance in the substrate, after the dopants have diffused from the mixture material source layer 31, is still considerably lower than the indicated lowest starting concentration value of 0.001 at. % in the mixture material source layer.

Still referring to FIG. 5, in an embodiment, a suitable elevated temperature of the step c), the annealing step 113, is between 800° C.-1100° C., more preferably between 850° C.-1000° C. and most preferably between 900° C.-950° C. The purpose of the elevated temperature is to provide diffusion of dopant substance or dopant substances from the mixture material source layer 31 to the substrate 10 and to the separation layer 30.

As a result of the method explained in relation to FIG. 5, the mixture material source layer 31 acts as a source of one or more dopant substances, during and after the annealing step 113 it becomes at least partially depleted and turns into a depleted mixture material source layer 35. By the same token, as the separation layer 30 receives at least part of the dopant substances of the mixture material source layer 31, it becomes a doped separation layer 36. Also the substrate 10 is now doped with the one or more dopant substances provided by the mixture material source layer 31. In other words, in the annealing step 113, the structure of layers 30-31 and substrate 10 is annealed with a temperature treatment 163, causing the dopant substance or dopant substances to diffuse to the separation layer 30. Only a small tail of the deposition can reach the area of the substrate 10, now a doped substrate 10*b*, as indicated with a low dopant substance density or dopant substance concentration region 37. This is indicated with graph 223, which is another schematic representation of the dopant substance concentration C(d) depth d profile shown with label 223*a* in the graph 223. This is in contrast to graph 221 that shows a very high concentration of dopant substances, as a step function, in the mixture material source layer 31 and essentially no dopant substance in other layers or in the substrate.

As there are two distinct layers related to the controlled diffusion release of dopant substances, the separation layer 30 and the mixture material source layer 31 are jointly called the dual-layer dopant source layer stack 41.

In FIG. 5, sequence 250*a* shows also the steps in a flow chart highlighting that in a method according to the invention, the steps of the method are to be carried out in the specific order of: an initial step 110', a separation layer deposition step 110, a mixture material source layer deposition step 111, and an annealing step 113. Thus, the order is from left to right in the sequence 250*a*, order also indicated by arrows.

Figure 6:
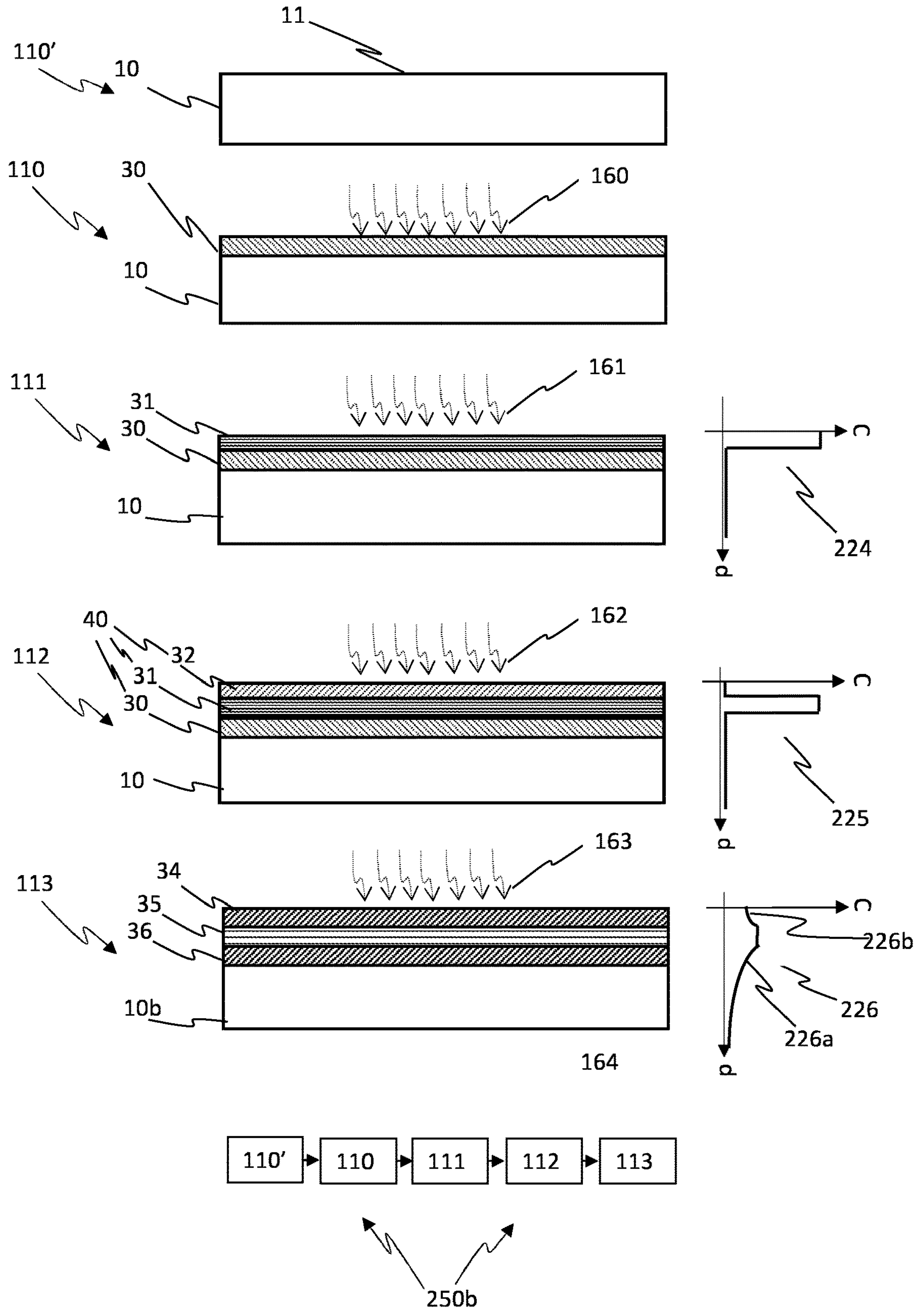
FIG. 6 shows schematics of the steps of a method according to another embodiment of the present invention.

Turning to FIG. 6, in an embodiment the method comprises, after the mixture material source layer deposition step 111 and before the annealing step 113, a diffusion drain layer deposition step 112, where a diffusion drain layer 32 is deposited over the mixture material source layer 31.

In an embodiment, after the mixture material source layer deposition step 111, and before the annealing step, the method comprises a diffusion drain layer deposition step 112, in which a diffusion drain layer 32 is deposited over the mixture material source layer 31. In this case, naturally, in the annealing step 113 all the deposited layers and the substrate are annealed. That is, the substrate 10, the separation layer 30, the mixture material source layer 31 and the diffusion drain layer 32 are annealed and heated to an elevated temperature to arrange diffusion of dopant substance from the mixture material source layer 31 to the substrate 10, to the diffusion drain layer 32 and to the separation layer 30 and 36.

In an embodiment, the diffusion drain layer deposition step 112 may be deposited with an atomic layer deposition method.

In another embodiment, the atomic layer deposition of the diffusion drain layer deposition step 112 is deposited with a first precursor being selected from the group of a stable oxide and an oxidising precursor, and a second precursor being the other from the group of a stable oxide and an oxidizing precursor. First precursor (precursor A) and second precursor (precursor B) are defined in conjunction with FIG. 3 above.

In yet another embodiment, the atomic layer deposition of the diffusion drain layer deposition step 112 is deposited with a first precursor being selected from the group of a silicon precursor and an oxidising precursor, and a second precursor being the other from the group of a silicon precursor and an oxidizing precursor. First precursor (precursor A) and second precursor (precursor B) are defined in conjunction with FIG. 3 above.

Related to FIG. 6, as there are three distinct layers related to the controlled diffusion release of dopant substances, separation layer 30, mixture material source layer 31 and diffusion drain layer 32 are jointly called the tri-layer dopant source layer stack 40. Further, in FIG. 6, the dopant substance concentration depth profile C is shown schematically in graphs 224-226, relative to the doping depth d. As in FIG. 5, the mixture material source layer 31 contains essentially all the dopant substances as indicated in graph 224 with a step function. The diffusion drain layer deposition step 112 moves the layer with the high concentration of dopant substance or dopant substances deeper in the structure, relative to the top layer or top surface of the structure. This is indicated with graph 225 which is another schematic representation of the dopant substance concentration depth profile after the deposition of the diffusion drain layer. In step 113, the structure of layers 30-32 and substrate 10 is annealed with a temperature treatment 163, causing the dopant substance or dopant substances to diffuse to both to the diffusion drain layer 32 and to the separation layer 30. Only a small tail of the deposition can reach the area of the substrate 10, now a doped substrate 10*b*. This is indicated with graph 226, which is another schematic representation of the dopant substance concentration depth profile. As can be seen from curves 226*a* and 226*b*, the diffusion drain layer creates a diffusion direction also away from the substrate 10, making less dopant substances available to diffuse towards the substrate 10. This is an additional, advantageous way to control accurately the dopant substance density in the substrate.

In other words, the diffusion drain layer 32 is advantageous as it provides a second direction for the dopant substance atoms to diffuse, enabling the tailoring of the diffusion provide in the substrate 10 even more accurately and making it easier to control very low concentrations of dopant substance reaching the substrate 10. Thus, diffusion drain layer 32 acts as a drain (or sink) for the dopant substance atoms and reduces and controls the net amount of dopant substances that can diffuse towards the substrate 10 during the annealing.

The elevated temperature of the annealing step 113 may again be between 800° C.-1100° C., more preferably between 850° C.-1000° C. and most preferably between 900° C.-950° C.

In an embodiment, the diffusion drain layer deposition step 112 may be deposited with the atomic layer deposition method. The atomic layer deposition of the diffusion drain layer deposition step 112 may be deposited with a silicon precursor as the first precursor and an oxidizing precursor as the second precursor.

In an embodiment, the atomic layer deposition of the diffusion drain layer deposition step 112 may be arranged a to deposit a diffusion drain layer of a thickness of 1 nm-10 nm, or more preferably 2 nm-8 nm; or most preferably 3 nm-5 nm.

In FIG. 6, sequence 250*b* shows also the steps in a flow chart highlighting that in a method according to an embodiment of the invention, the steps of the method are to be carried out in the specific order of: an initial step 110', a separation layer deposition step 110, a mixture material source layer deposition step 111, a diffusion drain layer deposition step 112, and an annealing step 113. Thus, the order is from left to right in the sequence 250*b*, order also indicated by arrows.

Figure 7:
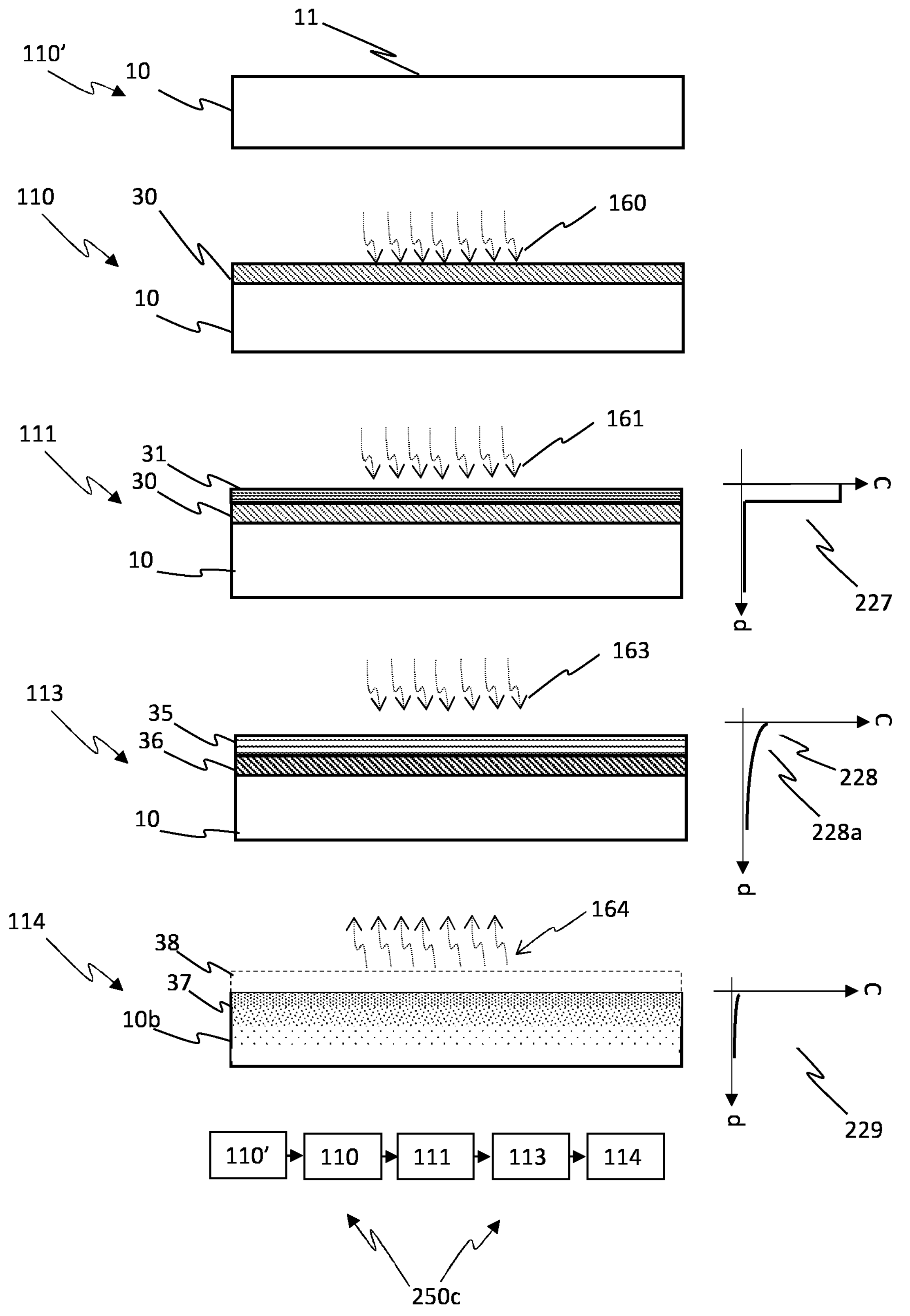
FIG. 7 shows schematics of the steps of a method according to yet another embodiment of the present invention.

FIG. 7 shows a method according an embodiment, comprising the steps represented in FIG. 6. In addition, FIG. 7 illustrates that after the annealing step 113, in the embodiment, the method comprises an etching step 114, where the deposited layers, the separation layer 30 and the mixture material source layer 31 are etched away with an etching treatment 164 and thus removed from the doped substrate 10*b*, leaving just the lightly doped substrate 10*b* to remain. In other words, after the annealing step 113, as step d), the method comprises an etching step 114, in which the layers deposited in the previous method steps are etched away and removed from the doped substrate 10*b*.

As above, after the mixture material source layer deposition step 111, the dopant substance concentration profile is a step function in the depth dimension, indicated with graph 227. After the annealing step 113, the dopant substance concentration becomes is a sloping and slowly decreasing function in the depth dimension, indicated with graph 228 and profile 228*a* C(d) vs. depth d.

Etching step 114 may comprise a dry etching step, also called a plasma etching step, or a wet etching step.

In dry etching, electromagnetic energy, typically radio frequency energy, is applied to a gas containing a chemically reactive element, such as fluorine or chlorine. The plasma releases positively charged ions which bombard the substrate or wafer. Thereby, material is removed.

For layers comprising silicon dioxide, buffered oxide etch (BOE), also known as buffered HF (hydrofluoric acid) or BHF, is usually used in a wet etching step especially when layers comprising silicon dioxide ($SiO_2$) or silicon nitride ($Si_3N_4$) are etched. Buffered oxide etch is a mixture of a buffering agent, such as ammonium fluoride ($NH_4F$), and hydrofluoric acid (HF).

In FIG. 7, label 38 points to the layers that are etched away and label 37 illustrates the monotonically decreasing low dopant substance density or dopant substance concentration. As graph 229 illustrates, a very low concentration of dopant substance or substances is achieved.

Ideally, deposition steps for separation layer deposition step, mixture material source layer deposition step and diffusion drain layer deposition step are deposited in a same deposition tool during and in one deposition run with suitable process parameters and precursors for separation layer, mixture material source layer and potential diffusion drain layer. The atomic layer deposition method is especially suitable for this purpose as the precursors and process temperatures can be adjusted for the deposition of each of the layers 30-32. In particular, it is advantageous that the deposition tool like the ALD coating tool does not need to be evacuated and heated for the deposition of each of the layers 30-32 separately, but instead the same process chambers (reaction and vacuum chambers) can be used, and the deposition steps of the individual layers can follow one another directly. In other words, the separation layer deposition step, the mixture material source layer deposition step and the diffusion drain layer deposition step can follow one another directly without breaking the vacuum or venting or cooling down the coating tool, e.g. an ALD tool. In other words, the mixture material source layer deposition step can follow directly the separation layer deposition step, and the diffusion drain layer deposition step can follow directly the mixture material source layer deposition step. This saves time and effort in depositing the dual-layer dopant source layer stack 41 or tri-layer dopant source layer stack 40. In general, a dopant source layer stack may comprise a dual-layer dopant source layer stack 41 or a tri-layer dopant source layer stack 40.

In FIG. 7, sequence 250*c* shows also the steps in a flow chart highlighting that in a method according to an embodiment of the invention, the steps of the method are to be carried out in the specific order of: an initial step 110', a separation layer deposition step 110, a mixture material source layer deposition step 111, an annealing step 113, and an etching step 114. That is, the order is from left to right in the sequence 250c, order also indicated by arrows. Again, the elevated temperature of the annealing step 113 may be between 800° C.-1100° C., more preferably between 850° C.-1000° C. and most preferably between 900° C.-950° C.

In another method according to an embodiment of the invention, the steps of the method are to be carried out in the specific order of: an initial step 110', a separation layer deposition step 110, a mixture material source layer deposition step 111, a diffusion drain layer deposition step 112, an annealing step 113, and an etching step 114 (this sequence is not shown in FIG. 7). Again, the elevated temperature of the annealing step 113 may again be between 800° C.-1100° C., more preferably between 850° C.-1000° C., and most preferably between 900° C.-950° C.

Figure 8A:
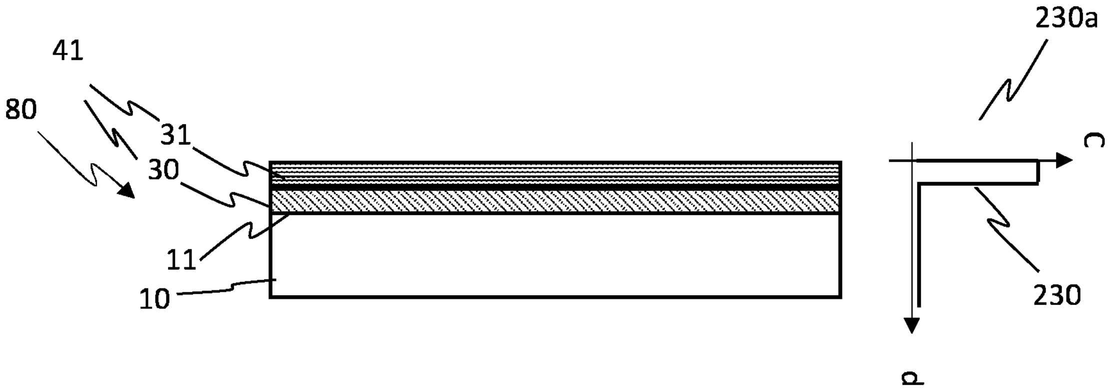
FIGS. 8*a* and 8*b* show an intermediate device according to the present invention.

FIG. 8a shows an intermediate semiconductor device 80 according to an aspect of the invention. The concept of "intermediate" means that the device is not ready in a sense of a typical semiconductor fabrication process. "Device" means, in the present application and in general, a semiconductor wafer or other suitable semiconductor substrate that has already gone through many typical semiconductor process steps and may have many such steps remaining and which is not yet spliced, packaged and bonded into a semiconductor product like an integrated circuit chip.

The intermediate semiconductor device 80 comprises a semiconductor substrate 10 comprising a surface 11. The intermediate semiconductor device comprises a dopant source layer stack comprising a separation layer 30 on the surface 11 of a substrate 10 and a mixture material source layer 31 on the separation layer 30, the mixture material source layer 31 comprising a mixture material comprising a dopant substance. The atomic percentage of the dopant substance in the mixture material source layer is arranged to be 0.001 at. %-10 at. %, or more preferably 0.01 at. %-1 at. %, or most preferably 0.05 at. %-0.5 at. %.

A dopant source layer stack 41 comprising two layers, a separation layer 30 on the surface 11 of a substrate 10 and a mixture material source layer 31 is specifically called a dual-layer dopant source layer stack. The intermediate semiconductor device may be realised with the method steps of the initial step 110', the separation layer deposition step 110 and the mixture material source layer deposition step 111 of FIG. 5, for example.

The concentration distribution 230 of the dopant substance in FIG. 8a forms a step-like function in graph 230a as the intermediate semiconductor device is not yet annealed in an annealing step 113 discussed e.g. in relation to FIG. 5.

In an embodiment, the dopant substance of the intermediate semiconductor device may comprise boron, phosphorous, antimony or arsenic. Boron is an advantageous substance for a p-type doping (acceptor type) and to arrange a p-type doped semiconductor or portion of a semiconductor. Similarly, phosphorous, antimony or arsenic are advantageous substances for an n-type doping (donor type) and to arrange an n-type doped semiconductor or portion of a semiconductor.

In an embodiment, the separation layer 30 of the intermediate semiconductor device may comprise silicon dioxide ($SiO_2$), and the mixture material source layer 31 of the intermediate semiconductor device may comprise phosphorous oxide ($PO_x$) and silicon dioxide ($SiO_2$). Alternatively, the separation layer 30 of the intermediate semiconductor device may comprise silicon dioxide ($SiO_2$), and the mixture material source layer 31 of the intermediate semiconductor device may comprise boron oxide ($BO_x$) and silicon dioxide ($SiO_2$). Alternatively, the separation layer 30 of the intermediate semiconductor device may comprise silicon dioxide ($SiO_2$), and the mixture material source layer 31 of the intermediate semiconductor device may comprise arsenic oxide ($AsO_x$) and silicon dioxide ($SiO_2$). Still alternatively, the separation layer 30 of the intermediate semiconductor device may comprise silicon dioxide ($SiO_2$), and the mixture material source layer 31 of the intermediate semiconductor device may comprise antimony oxide ($SbO_x$) and silicon dioxide ($SiO_2$).

In another embodiment, the separation layer 30 of the intermediate semiconductor device may comprise a stable oxide, and the mixture material source layer 31 of the intermediate semiconductor device may comprise phosphorous oxide ($PO_x$) and a stable oxide. Alternatively, the separation layer 30 of the intermediate semiconductor device may comprise a stable oxide, and the mixture material source layer 31 of the intermediate semiconductor device may comprise boron oxide ($BO_x$) and a stable oxide. Alternatively, the separation layer 30 of the intermediate semiconductor device may comprise a stable oxide, and the mixture material source layer 31 of the intermediate semiconductor device may comprise arsenic oxide ($AsO_x$) and a stable oxide. Still alternatively, the separation layer 30 of the intermediate semiconductor device may comprise a stable oxide, and the mixture material source layer 31 of the intermediate semiconductor device may comprise antimony oxide ($SbO_x$) and a stable oxide.

Figure 8B:
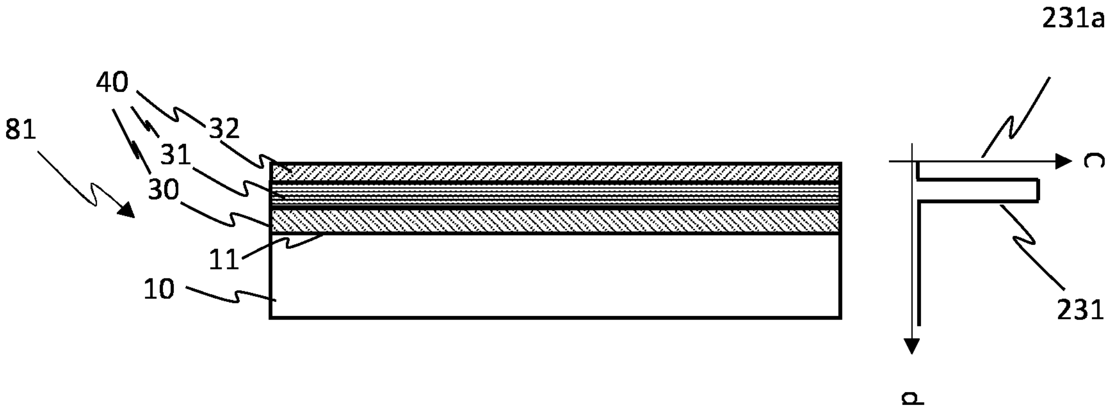

Turning to FIG. 8b, as shown in it, in an embodiment, the intermediate semiconductor device 81 may comprise a diffusion drain layer 32 on the mixture material source layer 31. Together, layers 30-32 can be called a tri-layer dopant source layer stack 40. The intermediate semiconductor device according to FIG. 8b may be arranged with the method steps 110' (the initial step), 110 (separation layer deposition step), 111 (a mixture material source layer deposition step, and 112 (a diffusion drain layer deposition step) of FIG. 6, for example. Again, in FIG. 8b, the concentration distribution 231 of the dopant substance forms a step-like function in graph 231a as the intermediate semiconductor device is not yet annealed in an annealing step 113 discussed e.g. in relation to FIG. 6. The peak concentration region has moved deeper to the layer structure when compared to the layer structure of FIG. 8a due to the diffusion drain layer 32.

Figure 9:
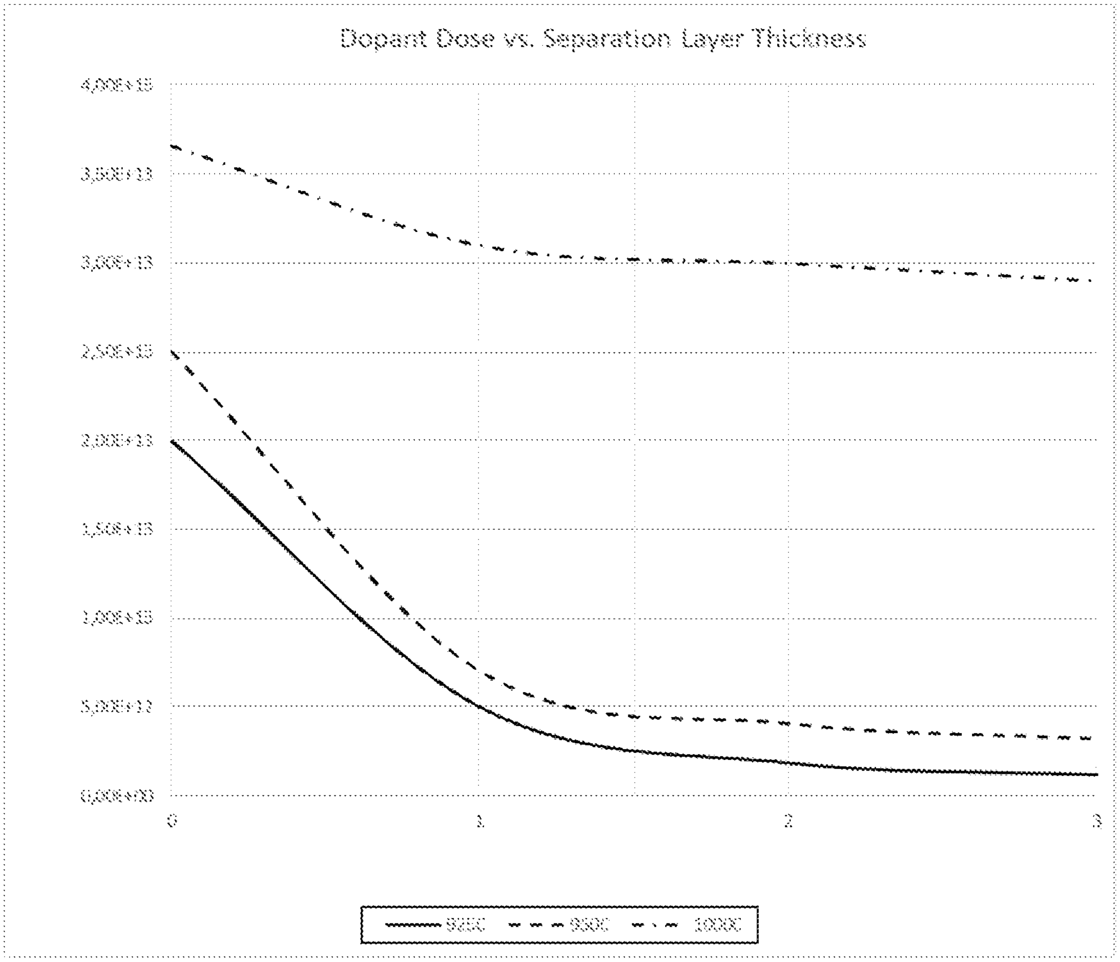
FIG. 9 shows a dopant substance concentration achieved with the method according to an embodiment of the invention at two annealing temperatures.

FIG. 9 shows measurement results dopant substance concentrations achieved according to the method of the invention, compared to the dopant substance concentrations achieved with prior art methods. The measurements show dopant substance concentrations (units $1/cm^3$) at the surface of sample substrates after a tri-layer dopant source layer stack has been etched away and removed from the doped substrate. In the data of FIG. 9, the samples were exposed to three different annealing temperatures of 925° C., 950° C. and 1000° C.

For the annealing at a temperature of 925° C., the results are shown with a solid line in FIG. 9. At the surface of the substrate, when no separation layer is present, dopant substance density is at $2\times10^{13}/cm^3$ level. When a separation layer of thickness of 2 nm was present, the dopant substance density drops to $1.87\times10^{12}/cm^3$.

For the annealing at a temperature of 950° C., the results are shown with a dashed line in FIG. 9. At the surface of the substrate, when no separation layer is present, dopant substance density is at $2.5\times10^{13}/cm^3$ level. When a separation layer of thickness of 2 nm was present, the dopant substance density drops to $4.06\times10^{12}/cm^3$.

With still higher annealing temperature of 1000° C., the dopant substance density is at $3\times10^{13}/cm^3$ level when a separation layer of thickness of 2 nm was present in the annealing step that drives the dopants to the substrate due to diffusion at elevated temperatures. Higher annealing temperatures can drive the dopant substances deeper into the substrate and cause a higher but a flatter dopant substance concentration depth profile as a function of the separation layer thickness.

Clearly, with a zero-thickness separation layer (that is, in the case of no separation layer), a very high doping concentration of $2\times10^{13}/cm^3$ or higher remains. This is not a suitable concentration for example for the SJ-MOS technologies. With a 2 nm separation layer thickness almost an order of magnitude smaller concentration can be achieved at the surface. With 3 nm separation layer thickness, a slightly smaller concentration when compared to 2 nm separation layer thickness is achieved. FIG. 9 clearly demonstrates that it is possible to control the concentration of the dopant substances in the substrate with a very high degree of accuracy. Adjusting the thickness of thin films with an accuracy in a range of a fraction of one nanometre is quite feasible with vapor-phase deposition methods and especially with the ALD method. Thus, a very accurate control of the dopant substance densities or concentrations can be achieved with the present invention.

Example: Deposition of a Tri-Layer Dopant Source Layer Stack

The following example shows detailed steps of an actual deposition run of the method and device according to an embodiment of the present invention. In the example, the tri-layer dopant source layer stack comprises:

1. a $SiO_2$ separation layer 30,
2. followed by a mixture of oxides, specifically a mixture material source layer comprising $SiO_2$ and $PO_x$ and deposited with the atomic layer deposition method to provide a mixture material source layer structure 31,
3. finalized with a $SiO_2$ diffusion drain layer 32.

In the example, the entire layer or film stack (separation layer 30, mixture material source layer 31 and diffusion drain layer 32) was prepared by atomic layer deposition (ALD) method, and the dopant substance, in this case elemental phosphorous, is driven into the substrate by post-deposition annealing. As already mentioned, ALD is an example of vapor phase deposition methods and based on alternate exposure of a surface or an object to at least two vapor phase chemicals (usually called precursor A, first precursor, and precursor B, the second precursor). Resulting layer is a product of said at least two precursors caused by a reaction of precursor A and precursor B. Resulting by-products that are released and which do not participate in the generation of the material layer are usually purged out of the reaction space or reaction area with an inert gas like nitrogen ($N_2$), helium (He) or argon (Ar).

In the current example, for mixture material source layer, also precursors C, third precursor, and D, fourth precursor, are deployed to generate a mixture material source layer.

The sample deposition was performed in Beneq TFS 200 ALD tool. The tool was operated in a thermal single-wafer mode, although batch or plasma configuration could also be used. The reaction chamber was made of aluminum and was heated to a temperature of 300° C.

The sample substrates were silicon (Si) wafers with a diameter of 200 mm (millimeter) and thickness of 0.7 mm and provided with various trench structures. Wafers were processed one at a time. Prior to the ALD deposition of the various layers, the wafer was exposed to 0.5% HF (hydrofluoric acid) etch for one minute, rinsed with de-ionized water, and dried with an inert nitrogen ($N_2$) blowing. The wafer was transferred into the tool's load lock within five minutes after etching. The load lock was pumped down to vacuum-like conditions (approximately 2 mbar). In all, the reactor chamber was maintained under a pressure of approximately 2 mbar during the entire deposition run.

The samples were coated with a sandwich-like structure comprising a bottom silicon dioxide $SiO_2$ film (2 nm) as the separation layer, a mixture material film of both $SiO_2$ and $PO_x$ (in total, 0.5 nm in thickness) as the mixture material source layer, and a $SiO_2$ film (5 nm) as the diffusion drain layer. In other words, the separation layer comprises silicon dioxide ($SiO_2$), the mixture material source layer comprises both $SiO_2$ and $PO_x$ and is 0.5 nm thick, and the diffusion drain layer comprises $SiO_2$ and is 5 nm thick.

All the films were deposited at a temperature of 300° C. in a continuous process flow without breaking the vacuum. This is a clear advantage for a predictable industrial process, making the process less prone for contamination and increases the process yield and reliability.

The details of the different layers in the tri-layer dopant source layer stack and their deposition are as follows:

Deposition of separation layer: First, the separation layer 30 of $SiO_2$ was deposited by the ALD method with SAM.24 (BDEAS, bis(diethylaminosilane)) as first precursor and ozone ($O_3$) as the second precursor. The Si precursor was delivered into the reactor from a Beneq HS300 hot source heated to 60° C. through a 600 μm orifice. Thickness of the separation layer generated was approximately 2 nm with 40 ALD cycles of first and second precursors.

The growth per cycle (GPC) of $SiO_2$ was approximately 0.05 nm/cycle and the number of cycles was adjusted accordingly to yield the desired film. 40×0.05 nm=2 nm Precursor pulses were followed by 4 s purges that cleaned away the excess precursors.

Deposition of mixture material source layer: Next, the mixture material source layer 31 was deposited, the mixture material comprising alternating $PO_x$ and $SiO_2$ depositions. The phosphorous oxide $PO_x$ was deposited using TMPO (trimethylphosphate) as the first precursor and $H_2O$ as the second precursor. Cycles of $PO_x$ and $SiO_2$ were alternated so that after one $PO_x$ cycle, one $SiO_2$ cycle followed, leading to a mixture material. A total of 10 $PO_x$ and 10 $SiO_2$ cycles were run, resulting in a thickness of approximately 0.5 nm for the mixture material source layer 31. TMPO was delivered by the load & release method, and water by vacuum draw through a bellows metering valve opened one turn. TMPO and water sources were kept at room temperature. The pulse length for water was 0.15 s. The TMPO pulse involved a 100 ms boost and 100 ms pulse. Precursor pulses were followed by 4 s purges. The growth per cycle of the source layer was slightly higher, and the layer was deposited by 9 or 10 cycles and with different mixed oxide ratios. For a $SiO_2$ to $PO_x$ ratio of 1:1, the pulsing was identical in all cycles, i.e., SAM.24/purge/$O_3$/purge/TMPO/purge/water/purge.

Deposition of the diffusion drain layer: Finally, the diffusion drain layer 32 was deposited with the same precursors as with the separation layer. Thickness of 5 nm was achieved with 100 cycles.

After preparing the tri-layer dopant source layer stack as discussed above, the sample was retracted from the reaction chamber and into the load lock. The load lock was vented, and the sample was cooled down before transferring into a wafer container in the cleanroom atmosphere. Once all the wafers were processed, the wafer container was sealed with cleanroom tape and packed in two nested bags for minimizing particle contamination. The samples were shipped to a third party where they were exposed to post-deposition annealing. The annealing temperature was varied between 925° C. and 1000° C., and the annealing time was typically 30 min.

Results: For measurements, a control sample was generated without the separation layer or the diffusion drain layer. Doping measurements were performed with SIMS (secondary ion mass spectrometry). Without the separation layer, the dopant substance concentration, that is, the elemental phosphorous concentration, for the purposes of was approximately 10× too high: Concentration of the dopant substance achieved with a method according to the invention was $1.7\times10^{12}/cm^3$, and without using the method (without the separation layer and the diffusion drain layer), the result was $2\times10^{13}/cm^3$, again validating that the invention is suitable for doping semiconductors with diffusion doping with good control of low dopant substance concentrations.

The invention has been described above with reference to the examples shown in the figures. However, the invention is in no way restricted to the above examples but may vary within the scope of the claims.

The invention claimed is:

1. A method for doping a semiconductor, the method comprising an initial step where a semiconductor substrate comprising a surface is placed into a deposition tool, wherein the method comprises, in the following order, the steps of:

a) depositing a separation layer on the surface of the semiconductor substrate in a separation layer deposition step, b) depositing a mixture material source layer in a mixture material source layer deposition step, in which the mixture material source layer comprising a mixture material is deposited on the separation layer, the mixture material of the mixture material source layer comprising a dopant substance, and c) annealing the semiconductor substrate, the separation layer, and the mixture material source layer in an annealing step, in which the substrate, the separation layer, and the mixture material source layer are heated to an elevated temperature to arrange diffusion of a dopant substance from the mixture material source layer to the substrate and to the separation layer, wherein the separation layer deposition step comprises atomic layer deposition, wherein the atomic layer deposition of the separation layer deposition step deposits the separation layer having a thickness of 0.5 nm-15 nm, wherein the mixture material source layer deposition step comprises atomic layer deposition, and wherein the atomic layer deposition of the mixture material source layer deposition deposits the mixture material source layer having a thickness of 0.1 nm-5 nm.

2. The method for doping a semiconductor according to claim 1, wherein the atomic layer deposition of the separation layer deposition step comprises depositing:

a first precursor being selected from the group of a precursor for a stable oxide and an oxidizing precursor, and a second precursor being the other from the group of a precursor for a stable oxide and an oxidizing precursor.

3. The method for doping a semiconductor according to claim 1, wherein the atomic layer deposition of the separation layer deposition step comprises depositing:

a first precursor selected from a group of a silicon precursor and an oxidizing precursor, and a second precursor being the other from the group of a silicon precursor and an oxidizing precursor.

4. The method for doping a semiconductor according to claim 1, wherein the atomic layer deposition of the mixture material source layer deposition is arranged to deposit the mixture material comprising:

a first precursor being selected from a group of a precursor for a stable oxide and an oxidizing precursor, arranged to deposit a first sub-material, a second precursor being the other from the group of a precursor for a stable oxide and an oxidizing precursor, arranged to deposit the first sub-material, a third precursor being selected from a group of a dopant precursor and an oxidizing precursor, arranged to deposit a second sub-material, and a fourth precursor being the other from the group of a dopant precursor and an oxidizing precursor, arranged to deposit the second sub-material.

5. The method for doping a semiconductor according to claim 1, wherein the atomic layer deposition of the mixture material source layer deposition deposits the mixture material comprising:

a first precursor being selected from the group of a silicon precursor and an oxidizing precursor, that deposits a first sub-material, a second precursor being the other from the group of a silicon precursor and an oxidizing precursor, that deposits the first sub-material, a third precursor being selected from the group of a dopant precursor and an oxidizing precursor, that deposits a second sub-material, and a fourth precursor being the other from the group of a dopant precursor and an oxidizing precursor, that deposits the second sub-material.

6. The method for doping a semiconductor according to claim 1, wherein the atomic layer deposition of the mixture material source layer deposition is arranged to deposit the mixture material comprising:

a first precursor being selected from the group of a precursor for a stable oxide and an oxidizing precursor, arranged to deposit a first sub-material, a second precursor being the other from the group of a precursor for a stable oxide and an oxidizing precursor, arranged to deposit a first sub-material, and a third precursor being a dopant precursor, arranged to introduce dopants to the first sub-material to arrange the mixture material of the mixture material source layer from the first sub-material.

7. The method for doping a semiconductor according to claim 1, wherein the atomic layer deposition of the mixture material source layer deposition step is deposits the mixture material comprising:

a first precursor being selected from the group of a silicon precursor and an oxidizing precursor, that deposits a first sub-material, a second precursor being the other from the group of a silicon precursor and an oxidizing precursor, that deposits the first sub-material, and a third precursor being a dopant precursor, that introduces dopants to the first sub-material to arrange the mixture material of the mixture material source layer from the first sub-material.

8. The method for doping a semiconductor according to claim 1, wherein the atomic layer deposition of the mixture material source layer deposition deposits the mixture material source layer comprising the mixture material, and an atomic ratio of the dopant substance in the deposited mixture material source layer is 0.001 at. %-10 at. %.

9. The method for doping a semiconductor according to claim 1, wherein the method further comprises:

after step b), the mixture material source layer deposition step, and before step c), the annealing step, a step b2), a diffusion drain layer deposition step, in which a diffusion drain layer is deposited over the mixture material source layer; and in step c), the annealing step, the substrate, the separation layer, the mixture material source layer and the diffusion drain layer are annealed and heated to an elevated temperature to arrange diffusion of the dopant substance from the mixture material source layer to the substrate, to the diffusion drain layer and to the separation layer.

10. The method for doping a semiconductor according to claim 9, wherein the diffusion drain layer deposition is deposited using atomic layer deposition.

11. The method for doping a semiconductor according to claim 10, wherein the atomic layer deposition of the diffusion drain layer deposition is arranged to deposit the diffusion drain layer comprising:

a first precursor being selected from the group of a stable oxide and an oxidizing precursor, and a second precursor being the other from the group of a stable oxide and an oxidizing precursor.

12. The method for doping a semiconductor according to claim 10, wherein the atomic layer deposition of the diffusion drain layer deposition deposits the diffusion drain layer comprising:

a first precursor being selected from the group of a silicon precursor and an oxidizing precursor, and a second precursor being the other from the group of a silicon precursor and an oxidizing precursor.

13. The method for doping a semiconductor according to claim 9, wherein the diffusion drain layer deposition step deposits the diffusion drain layer having a thickness of 1 nm-10 nm.

14. The method for doping a semiconductor according to claim 1, wherein the elevated temperature of the annealing step is between 800° C.-1100° C.

15. The method for doping a semiconductor according to claim 1, wherein after the annealing step c), as step d), the method further comprises an etching step, in which the layers deposited are etched away and removed from the semiconductor substrate.

* * * * *